US007580172B2

(12) United States Patent
Lewis et al.

(10) Patent No.: US 7,580,172 B2
(45) Date of Patent: Aug. 25, 2009

(54) MEMS DEVICE AND INTERCONNECTS FOR SAME

(75) Inventors: Alan G. Lewis, Sunnyvale, CA (US); Manish Kothari, Cupertino, CA (US); John Batey, Cupertino, CA (US); Teruo Sasagawa, Los Gatos, CA (US); Ming-Hau Tung, San Francisco, CA (US); Gregory D. U'Ren, Berkeley, CA (US); Stephen Zee, San Jose, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 314 days.

(21) Appl. No.: 11/540,485

(22) Filed: Sep. 29, 2006

(65) Prior Publication Data

US 2007/0103028 A1    May 10, 2007

Related U.S. Application Data

(60) Provisional application No. 60/723,540, filed on Sep. 30, 2005.

(51) Int. Cl.
*G02F 1/03* (2006.01)
*G02B 26/00* (2006.01)
(52) U.S. Cl. .................... 359/245; 359/290
(58) Field of Classification Search .......... 359/245
See application file for complete search history.

(56) References Cited

U.S. PATENT DOCUMENTS

| 3,656,836 | A | 4/1972 | de Cremoux et al. |
| 4,377,324 | A | 3/1983 | Durand et al. |
| 4,403,248 | A | 9/1983 | te Velde |
| 4,459,182 | A | 7/1984 | te Velde |
| 4,482,213 | A | 11/1984 | Piliavin et al. |
| 4,859,060 | A | 8/1989 | Kitagiri et al. |
| 4,863,245 | A | 9/1989 | Roxlo |
| 4,965,562 | A | 10/1990 | Verhulst |

(Continued)

FOREIGN PATENT DOCUMENTS

CH          680534          9/1992

(Continued)

OTHER PUBLICATIONS

Search Report and Written Opinion for PCT/US2006/038084 (Sep. 29, 2006).

(Continued)

*Primary Examiner*—Jordan M. Schwartz
*Assistant Examiner*—James C Jones
(74) *Attorney, Agent, or Firm*—Knobbe, Martens, Olson & Bear, LLP

(57) ABSTRACT

A microelectromechanical systems device having an electrical interconnect between circuitry outside the device and at least one of an electrode and a movable layer within the device. At least a portion of the electrical interconnect is formed from the same material as a conductive layer between the electrode and a mechanical layer of the device. In an embodiment, this conductive layer is a sacrificial layer that is subsequently removed to form a cavity between the electrode and the movable layer. The sacrificial layer is preferably formed of molybdenum, doped silicon, tungsten, or titanium. According to another embodiment, the conductive layer is a movable reflective layer that preferably comprises aluminum.

47 Claims, 36 Drawing Sheets

U.S. PATENT DOCUMENTS

| | | | |
|---|---|---|---|
| 5,037,173 A | 8/1991 | Sampsell et al. | |
| 5,061,049 A | 10/1991 | Hornbeck | |
| 5,078,479 A | 1/1992 | Vuilleumier | |
| 5,079,544 A | 1/1992 | DeMond et al. | |
| 5,099,353 A | 3/1992 | Hornbeck | |
| 5,142,405 A | 8/1992 | Hornbeck | |
| 5,214,419 A | 5/1993 | DeMond et al. | |
| 5,214,420 A | 5/1993 | Thompson et al. | |
| 5,218,472 A | 6/1993 | Jozefowicz et al. | |
| 5,226,099 A | 7/1993 | Mignardi et al. | |
| 5,272,473 A | 12/1993 | Thompson et al. | |
| 5,293,272 A | 3/1994 | Jannson et al. | |
| 5,312,512 A | 5/1994 | Allman et al. | |
| 5,312,513 A | 5/1994 | Florence et al. | |
| 5,315,370 A | 5/1994 | Bulow | |
| 5,327,286 A | 7/1994 | Sampsell et al. | |
| 5,381,232 A | 1/1995 | van Wijk | |
| 5,474,865 A | 12/1995 | Vasudev | |
| 5,488,505 A | 1/1996 | Engle | |
| 5,506,597 A | 4/1996 | Thompson et al. | |
| 5,515,076 A | 5/1996 | Thompson et al. | |
| 5,523,803 A | 6/1996 | Urbanus et al. | |
| 5,526,688 A | 6/1996 | Boysel et al. | |
| 5,563,398 A | 10/1996 | Sampsell | |
| 5,578,976 A | 11/1996 | Yao | |
| 5,597,736 A | 1/1997 | Sampsell | |
| 5,602,671 A | 2/1997 | Hornbeck | |
| 5,629,790 A | 5/1997 | Neukermans et al. | |
| 5,638,946 A | 6/1997 | Zavracky | |
| 5,665,997 A | 9/1997 | Weaver et al. | |
| 5,674,757 A | 10/1997 | Kim | |
| 5,706,022 A | 1/1998 | Hato | |
| 5,737,050 A | 4/1998 | Takahara et al. | |
| 5,771,321 A | 6/1998 | Stern | |
| 5,784,189 A | 7/1998 | Bozler et al. | |
| 5,818,095 A | 10/1998 | Sampsell | |
| 5,822,170 A | 10/1998 | Cabuz et al. | |
| 5,824,608 A | 10/1998 | Gotoh et al. | |
| 5,835,256 A | 11/1998 | Huibers | |
| 5,943,155 A | 8/1999 | Goossen | |
| 5,945,980 A | 8/1999 | Moissey et al. | |
| 5,959,763 A | 9/1999 | Bozler et al. | |
| 5,967,163 A | 10/1999 | Pan et al. | |
| 5,976,902 A | 11/1999 | Shih | |
| 5,994,174 A | 11/1999 | Carey et al. | |
| 6,031,653 A | 2/2000 | Yu | |
| 6,040,937 A | 3/2000 | Miles | |
| 6,088,162 A | 7/2000 | Someno | |
| 6,097,145 A | 8/2000 | Kastalsky et al. | |
| 6,099,132 A | 8/2000 | Kaeriyama | |
| 6,137,150 A | 10/2000 | Takeuchi et al. | |
| 6,158,156 A | 12/2000 | Patrick | |
| 6,160,833 A | 12/2000 | Floyd et al. | |
| 6,171,945 B1 | 1/2001 | Mandal et al. | |
| 6,194,323 B1 | 2/2001 | Downey et al. | |
| 6,201,633 B1 | 3/2001 | Peeters et al. | |
| 6,219,015 B1 | 4/2001 | Bloom et al. | |
| 6,243,149 B1 | 6/2001 | Swanson et al. | |
| 6,249,039 B1 | 6/2001 | Harvey et al. | |
| 6,275,220 B1 | 8/2001 | Nitta | |
| 6,282,010 B1 | 8/2001 | Sulzbach et al. | |
| 6,288,824 B1 | 9/2001 | Kastalsky et al. | |
| 6,323,982 B1 | 11/2001 | Hornbeck | |
| 6,327,071 B1 | 12/2001 | Kimura et al. | |
| 6,333,556 B1 | 12/2001 | Juengling et al. | |
| 6,335,224 B1 | 1/2002 | Peterson | |
| 6,340,435 B1 | 1/2002 | Bjorkman et al. | |
| 6,376,787 B1 | 4/2002 | Martin et al. | |
| 6,391,675 B1 | 5/2002 | Ehmke et al. | |
| 6,392,781 B1 | 5/2002 | Kim et al. | |
| 6,399,257 B1 | 6/2002 | Shirota et al. | |
| 6,424,094 B1 | 7/2002 | Feldman | |
| 6,438,282 B1 | 8/2002 | Takeda et al. | |
| 6,449,084 B1 | 9/2002 | Guo | |
| 6,452,124 B1 | 9/2002 | York et al. | |
| 6,452,465 B1 | 9/2002 | Brown et al. | |
| 6,466,354 B1 | 10/2002 | Gudeman | |
| 6,466,358 B2 | 10/2002 | Tew | |
| 6,513,911 B1 | 2/2003 | Ozaki et al. | |
| 6,549,195 B2 | 4/2003 | Hikida et al. | |
| 6,549,338 B1 | 4/2003 | Wolverton et al. | |
| 6,552,840 B2 | 4/2003 | Knipe | |
| 6,574,033 B1 | 6/2003 | Chui et al. | |
| 6,589,625 B1 | 7/2003 | Kothari et al. | |
| 6,600,201 B2 | 7/2003 | Hartwell et al. | |
| 6,608,268 B1 | 8/2003 | Goldsmith | |
| 6,624,944 B1 | 9/2003 | Wallace et al. | |
| 6,639,724 B2 | 10/2003 | Bower et al. | |
| 6,643,069 B2 | 11/2003 | Dewald | |
| 6,650,455 B2 | 11/2003 | Miles | |
| 6,653,997 B2 | 11/2003 | Van Gorkom et al. | |
| 6,660,656 B2 | 12/2003 | Cheung et al. | |
| 6,671,149 B1 | 12/2003 | Chea et al. | |
| 6,674,562 B1 | 1/2004 | Miles | |
| 6,720,267 B1 | 4/2004 | Chen et al. | |
| 6,741,377 B2 | 5/2004 | Miles | |
| 6,743,570 B2 | 6/2004 | Harnett et al. | |
| 6,747,785 B2 | 6/2004 | Chen et al. | |
| 6,747,800 B1 | 6/2004 | Lin | |
| 6,791,441 B2 | 9/2004 | Pillans et al. | |
| 6,794,119 B2 | 9/2004 | Miles | |
| 6,803,534 B1 | 10/2004 | Chen et al. | |
| 6,806,557 B2 | 10/2004 | Ding | |
| 6,809,788 B2 | 10/2004 | Yamada et al. | |
| 6,811,267 B1 | 11/2004 | Allen et al. | |
| 6,819,469 B1 | 11/2004 | Koba | |
| 6,844,959 B2 | 1/2005 | Huibers et al. | |
| 6,855,610 B2 | 2/2005 | Tung et al. | |
| 6,858,080 B2 | 2/2005 | Linares et al. | |
| 6,859,301 B1 | 2/2005 | Islam et al. | |
| 6,870,581 B2 | 3/2005 | Li et al. | |
| 6,906,847 B2 | 6/2005 | Huibers et al. | |
| 6,912,022 B2 | 6/2005 | Lin et al. | |
| 6,912,082 B1 | 6/2005 | Lu et al. | |
| 6,940,631 B2 | 9/2005 | Ishikawa | |
| 6,947,200 B2 | 9/2005 | Huibers | |
| 6,952,303 B2 | 10/2005 | Lin et al. | |
| 6,958,847 B2 | 10/2005 | Lin | |
| 6,959,990 B2 | 11/2005 | Penn | |
| 6,980,350 B2 | 12/2005 | Hung et al. | |
| 6,995,890 B2 | 2/2006 | Lin | |
| 6,999,225 B2 | 2/2006 | Lin | |
| 6,999,236 B2 | 2/2006 | Lin | |
| 7,016,099 B2 | 3/2006 | Ikeda et al. | |
| 7,049,164 B2 | 5/2006 | Bruner | |
| 7,064,880 B2 | 6/2006 | Mushika | |
| 7,078,293 B2 | 7/2006 | Lin et al. | |
| 7,110,158 B2 | 9/2006 | Miles | |
| 7,123,216 B1 | 10/2006 | Miles | |
| 7,126,741 B2 | 10/2006 | Wagner et al. | |
| 7,142,346 B2 | 11/2006 | Chui et al. | |
| 7,145,213 B1 | 12/2006 | Ebel | |
| 7,161,730 B2 | 1/2007 | Floyd | |
| 7,172,915 B2 | 2/2007 | Lin et al. | |
| 7,184,202 B2 | 2/2007 | Miles et al. | |
| 7,250,315 B2 | 7/2007 | Miles | |
| 7,256,922 B2 | 8/2007 | Chui et al. | |
| 7,259,865 B2 | 8/2007 | Cummings et al. | |
| 7,291,921 B2 | 11/2007 | Lin | |
| 7,323,217 B2 | 1/2008 | Lin et al. | |
| 7,327,510 B2 | 2/2008 | Cummings et al. | |
| 7,349,136 B2 | 3/2008 | Chui | |
| 7,369,296 B2 | 5/2008 | Floyd | |
| 7,373,026 B2 | 5/2008 | Chui | |

| | | |
|---|---|---|
| 7,405,861 B2 | 7/2008 | Floyd |
| 2001/0010953 A1 | 8/2001 | Kang et al. |
| 2001/0026951 A1 | 10/2001 | Vergani et al. |
| 2001/0040649 A1 | 11/2001 | Ozaki |
| 2001/0055208 A1 | 12/2001 | Kimura |
| 2002/0014579 A1 | 2/2002 | Dunfield |
| 2002/0036304 A1 | 3/2002 | Ehmke et al. |
| 2002/0054424 A1 | 5/2002 | Miles |
| 2002/0058422 A1 | 5/2002 | Jang et al. |
| 2002/0070931 A1 | 6/2002 | Ishikawa |
| 2002/0109899 A1 | 8/2002 | Ohtaka et al. |
| 2002/0114558 A1 | 8/2002 | Nemirovsky |
| 2002/0145185 A1 | 10/2002 | Schrauger |
| 2002/0149850 A1 | 10/2002 | Heffner et al. |
| 2002/0167072 A1 | 11/2002 | Andosca |
| 2002/0167730 A1 | 11/2002 | Needham et al. |
| 2002/0171610 A1 | 11/2002 | Siwinski et al. |
| 2002/0186209 A1 | 12/2002 | Cok |
| 2002/0195681 A1 | 12/2002 | Melendez et al. |
| 2003/0007107 A1 | 1/2003 | Chae |
| 2003/0015936 A1 | 1/2003 | Yoon et al. |
| 2003/0021004 A1 | 1/2003 | Cunningham et al. |
| 2003/0053078 A1 | 3/2003 | Missey et al. |
| 2003/0077843 A1 | 4/2003 | Yamauchi et al. |
| 2003/0102771 A1 | 6/2003 | Akiba et al. |
| 2003/0118920 A1 | 6/2003 | Johnstone et al. |
| 2003/0123123 A1 | 7/2003 | Huffman |
| 2003/0123125 A1 | 7/2003 | Little |
| 2003/0132822 A1 | 7/2003 | Ko et al. |
| 2003/0156315 A1 | 8/2003 | Li et al. |
| 2003/0164350 A1 | 9/2003 | Hanson et al. |
| 2003/0179527 A1 | 9/2003 | Chea |
| 2003/0210851 A1 | 11/2003 | Fu et al. |
| 2004/0012298 A1* | 1/2004 | Cunningham et al. ........ 310/306 |
| 2004/0051929 A1 | 3/2004 | Sampsell et al. |
| 2004/0058531 A1 | 3/2004 | Miles et al. |
| 2004/0058532 A1 | 3/2004 | Miles et al. |
| 2004/0061543 A1 | 4/2004 | Nam et al. |
| 2004/0080035 A1 | 4/2004 | Delapierre |
| 2004/0080807 A1 | 4/2004 | Chen et al. |
| 2004/0100594 A1 | 5/2004 | Huibers et al. |
| 2004/0100677 A1 | 5/2004 | Huibers et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0125347 A1 | 7/2004 | Patel et al. |
| 2004/0125536 A1 | 7/2004 | Arney et al. |
| 2004/0136076 A1 | 7/2004 | Tayebati |
| 2004/0140557 A1 | 7/2004 | Sun et al. |
| 2004/0150869 A1 | 8/2004 | Kasai |
| 2004/0150936 A1 | 8/2004 | Chea |
| 2004/0150939 A1 | 8/2004 | Huff |
| 2004/0175577 A1 | 9/2004 | Lin et al. |
| 2004/0191937 A1 | 9/2004 | Patel et al. |
| 2004/0217264 A1 | 11/2004 | Wood et al. |
| 2004/0217919 A1 | 11/2004 | Pichl et al. |
| 2004/0233503 A1 | 11/2004 | Kimura |
| 2005/0012577 A1 | 1/2005 | Pillans et al. |
| 2005/0012975 A1 | 1/2005 | George et al. |
| 2005/0024557 A1 | 2/2005 | Lin |
| 2005/0030490 A1 | 2/2005 | Huibers |
| 2005/0035699 A1 | 2/2005 | Tsai |
| 2005/0042117 A1 | 2/2005 | Lin |
| 2005/0046919 A1 | 3/2005 | Taguchi et al. |
| 2005/0046922 A1 | 3/2005 | Lin et al. |
| 2005/0057442 A1 | 3/2005 | Way |
| 2005/0078348 A1 | 4/2005 | Lin |
| 2005/0128565 A1 | 6/2005 | Ljungblad |
| 2005/0249966 A1 | 11/2005 | Tung et al. |
| 2005/0250235 A1 | 11/2005 | Miles et al. |
| 2005/0253820 A1 | 11/2005 | Horiuchi |
| 2006/0024880 A1 | 2/2006 | Chui et al. |
| 2006/0056001 A1 | 3/2006 | Taguchi et al. |
| 2006/0066511 A1 | 3/2006 | Chui |
| 2006/0066932 A1* | 3/2006 | Chui et al. .................. 359/247 |
| 2006/0077504 A1 | 4/2006 | Floyd |
| 2006/0077528 A1 | 4/2006 | Floyd |
| 2006/0077529 A1 | 4/2006 | Chui et al. |
| 2006/0091824 A1 | 5/2006 | Pate et al. |
| 2006/0094143 A1 | 5/2006 | Haluzak |
| 2006/0209386 A1 | 9/2006 | Sudak et al. |
| 2006/0261330 A1 | 11/2006 | Miles |
| 2007/0019280 A1 | 1/2007 | Sasagawa et al. |
| 2007/0121205 A1 | 5/2007 | Miles |
| 2007/0206267 A1 | 9/2007 | Tung et al. |
| 2007/0236774 A1 | 10/2007 | Gousev et al. |
| 2008/0093688 A1 | 4/2008 | Cummings et al. |
| 2008/0144163 A1 | 6/2008 | Floyd |
| 2008/0192328 A1 | 8/2008 | Chui |
| 2008/0192329 A1 | 8/2008 | Chui |
| 2008/0268620 A1 | 10/2008 | Floyd |

FOREIGN PATENT DOCUMENTS

| | | |
|---|---|---|
| CN | 157313 | 5/1991 |
| EP | 0 035 299 A2 | 9/1981 |
| EP | 0 667 548 | 8/1995 |
| EP | 1 170 618 | 1/2002 |
| EP | 1 243 550 A2 | 9/2002 |
| EP | 1 452 481 | 9/2004 |
| EP | 1 473 581 | 11/2004 |
| EP | 1 484 635 | 12/2004 |
| JP | 02-068513 | 3/1990 |
| JP | 06-281956 | 10/1994 |
| JP | 07-45550 | 2/1995 |
| JP | 09-036387 | 2/1997 |
| JP | 10-116996 | 5/1998 |
| JP | 11-243214 | 9/1999 |
| JP | 11-263012 | 9/1999 |
| JP | 2000-040831 | 2/2000 |
| JP | 2002-062505 | 2/2002 |
| JP | 2002-296521 | 10/2002 |
| JP | 2002-341267 | 11/2002 |
| JP | 2003-057571 | 2/2003 |
| JP | 2003195201 | 7/2003 |
| JP | 2005-051007 | 2/2005 |
| KR | 2002-9270 | 10/1999 |
| WO | WO 97/17628 | 5/1997 |
| WO | WO 99/34484 | 7/1999 |
| WO | WO 99/52006 | 10/1999 |
| WO | WO 03/046508 | 6/2003 |
| WO | WO 03/052506 | 6/2003 |
| WO | WO 03/069404 | 8/2003 |
| WO | WO 2004/000717 | 12/2003 |
| WO | WO 2004/015741 | 2/2004 |
| WO | WO 2005/066596 | 7/2005 |
| WO | WO 2005/124869 | 12/2005 |

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.

Butler et al., "An Embedded Overlay Concept for Microsystems Packaging," IEEE Transactions on Advanced Packaging IEEE USA, vol. 23, No. 4, pp. 617-622, XP002379648 (2000).

Chu, et al. "Formation and Microstructures of Anodic Aluminoa Films from Aluminum Sputtered onglass Substrate" Journal of the Electrochemical Society, 149 (7) B321-B327 (2002).

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 Jun. 1996 IOP Publishing.

Furneaux, et al. "The Formation of Controlled-porosity membranes from Anodically Oxidized Aluminium" Nature vo 337 Jan. 12, 1989, pp. 147-149.

Goossen et al., "Possible Display Applications of the Silicon Mechanical Anti-Reflection Switch," Society for Information Display (1994).

Hall, Integrated optical inteferometric detection method for micromachined capacitiive acoustic transducers, App. Phy. Let. 80:20(3859-3961) May 20, 2002.

Kawamura et al., Fabrication of fine metal microstructures packaged in the bonded glass substrates, Proceedings of SPIE, vol. 3893, pp. 486-493, 1999.

Kim et al., "Control of Optical Transmission Through Metals Perforated With Subwavelength Hole Arrays," Optic Letters, vol. 24, No. 4, pp. 256-258 (Feb. 1999).

Matsumoto et al., Novel prevention method of stiction using silicon anodization for SOI structure, Sensors and Actuators, 72:2(153-159) Jan. 19, 1999.

Watanabe et al., Reduction of microtrenching and island formation in oxide plasma etching by employing electron beam charge neutralization, Applied Physics Letters, 79:17(2698-2700), Oct. 22, 2001.

Xactix Xetch Product Information.

Xactix Xetch X# Specifications, http:--www.xactix.com-Xtech X3specs.htm, Jan. 5, 2005.

IPRP for PCT/US2006/038084 filed Sep. 29, 2006.

\* cited by examiner

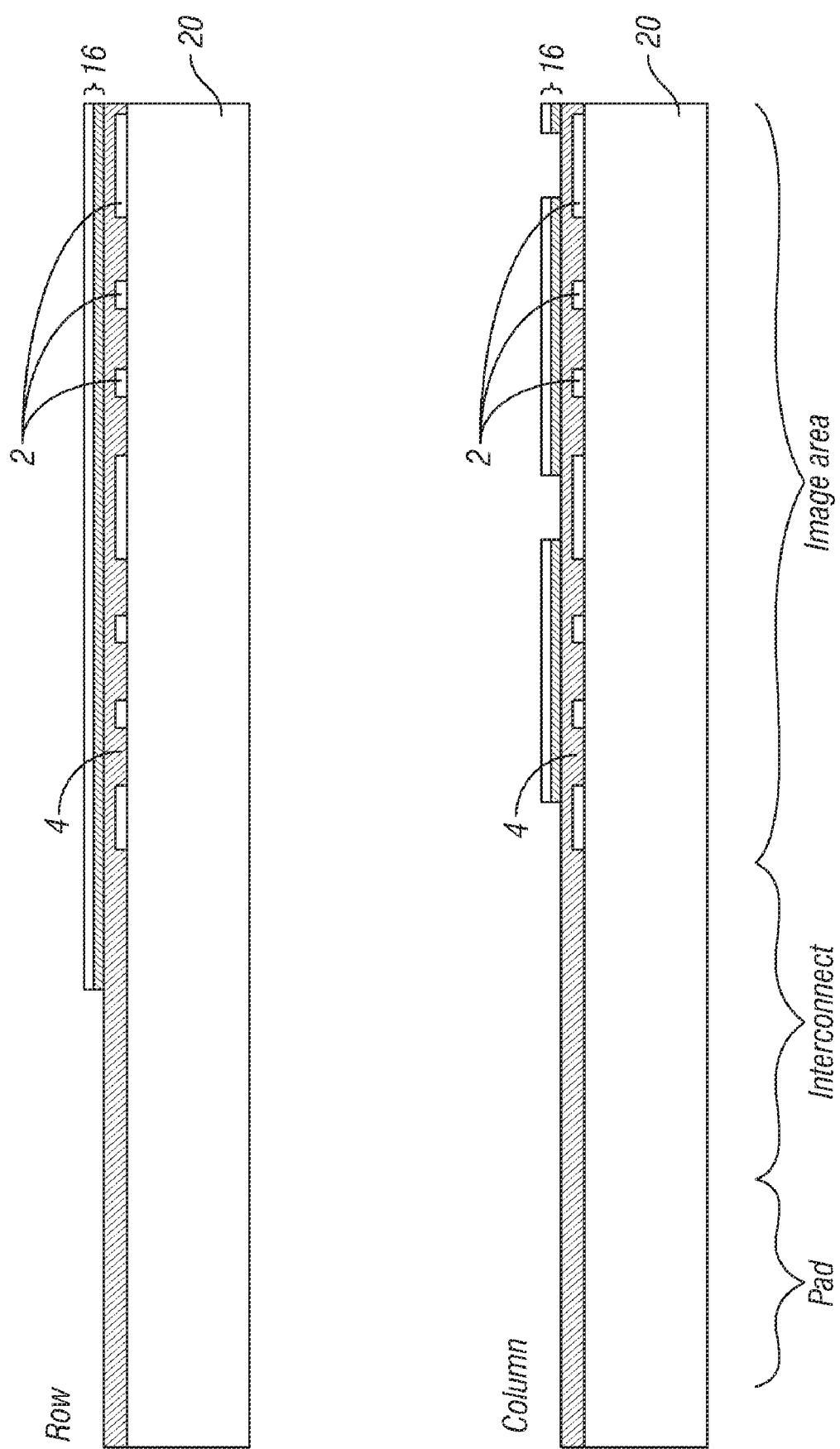

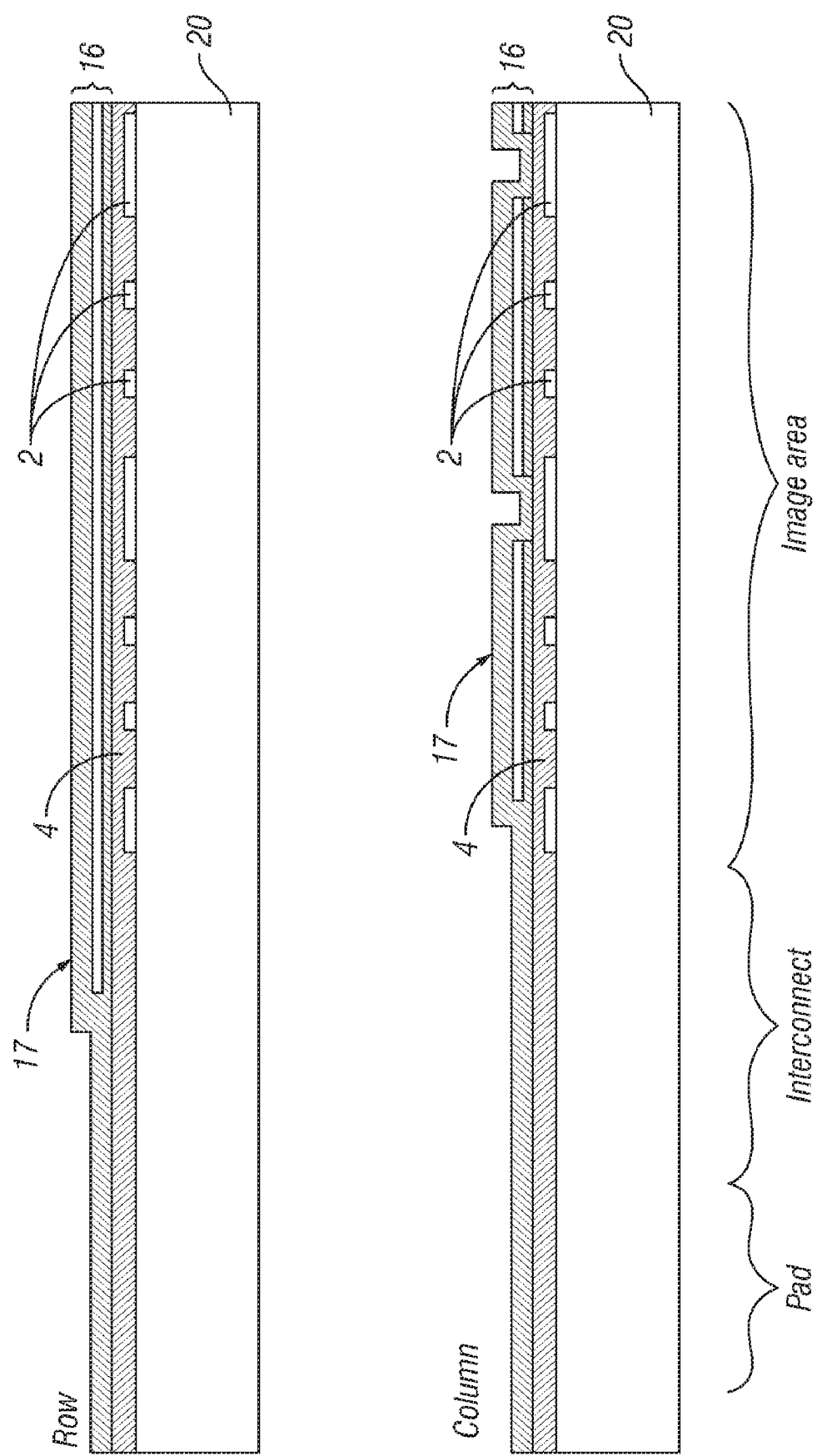

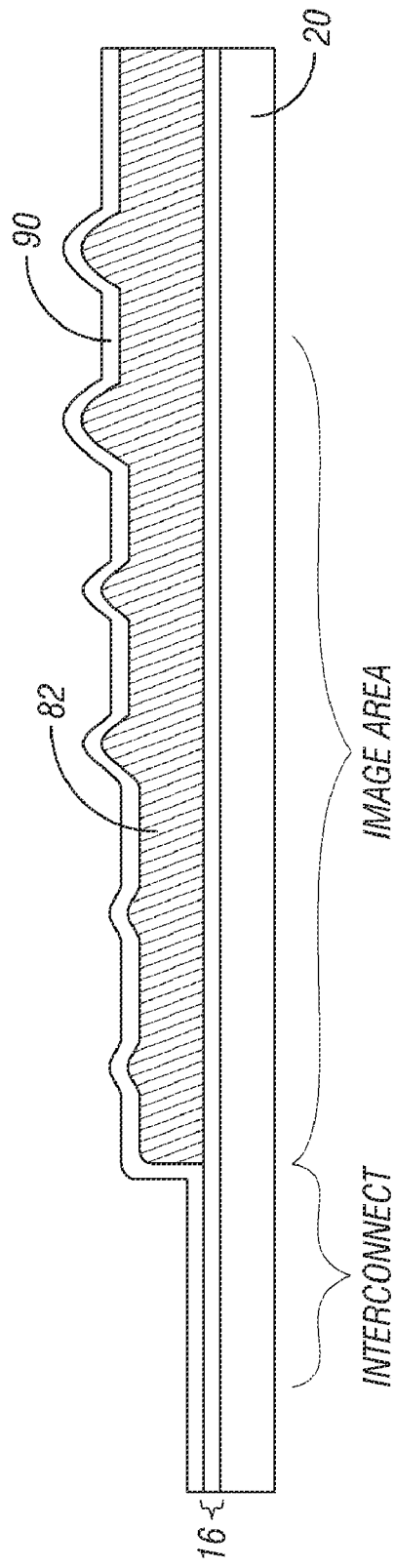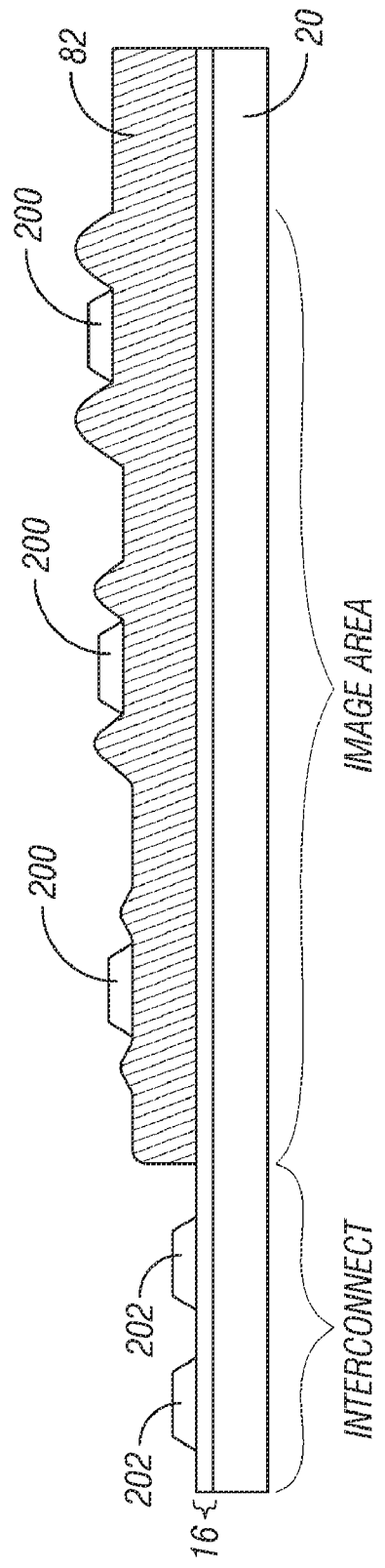

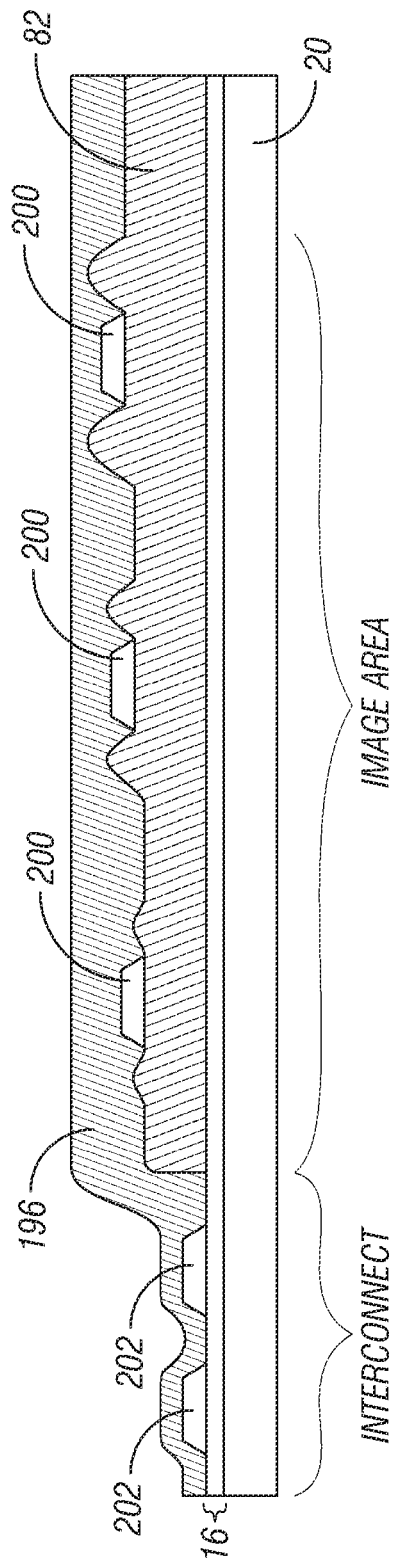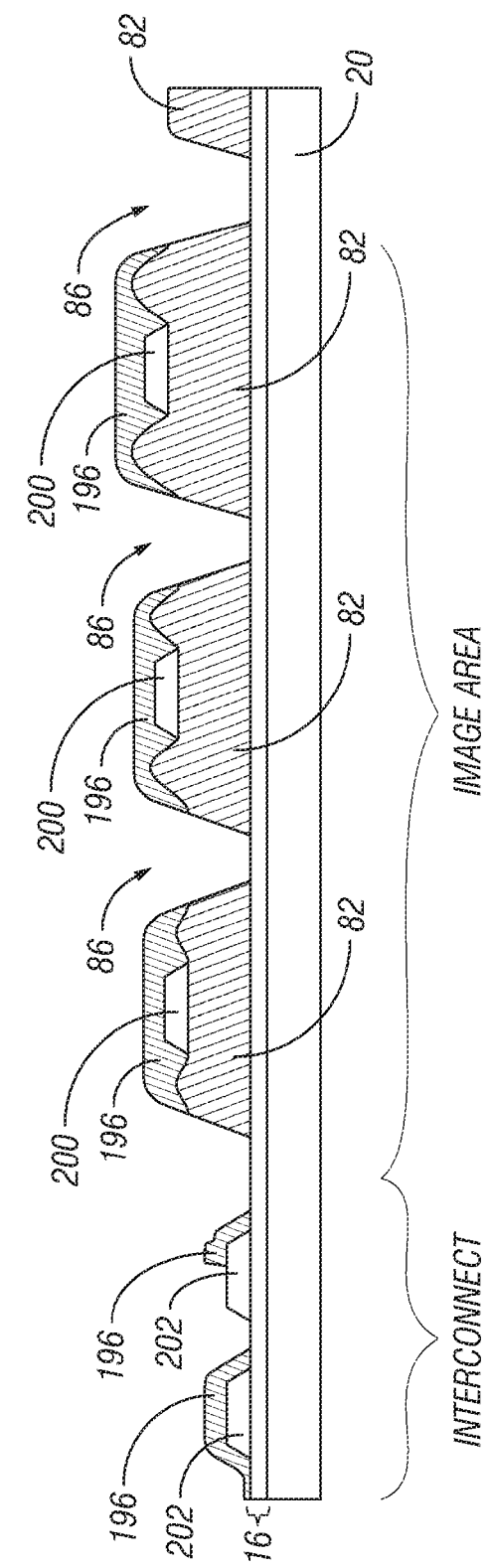

MEMS DEVICE AND INTERCONNECTS FOR SAME

CROSS REFERENCE TO RELATED APPLICATIONS

This application claims the benefit of U.S. Provisional Patent Application No. 60/723,540, filed on Sep. 30, 2005.

BACKGROUND

1. Field

The field of the invention relates to microelectromechanical systems (MEMS). More specifically, the field of the invention relates to interferometric modulators and methods of fabricating electrical interconnects for the same.

2. Description of the Related Technology

Microelectromechanical systems (MEMS) include micro mechanical elements, actuators, and electronics. Micromechanical elements may be created using deposition, etching, and/or other micromachining processes that remove parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An embodiment provides a microelectromechanical systems device is provided. The device includes an electrode, a movable layer, a mechanical layer over the movable layer, a cavity between the electrode and the movable layer, a conductive layer between the electrode and the mechanical layer, and an electrical interconnect between circuitry outside the device and at least one of the electrode and the movable layer. At least a portion of the electrical interconnect and a conductive layer are formed from a same material.

According to another embodiment, a method is provided for forming a microelectromechanical systems device. An electrode is provided. A conductive layer is provided over the electrode. The conductive layer is then patterned to form an electrical interconnect between circuitry outside the device and at least one of the electrode and another electrode within the device. A mechanical layer is formed over the conductive layer after patterning the conductive layer.

According to yet another embodiment, a method is provided for forming a microelectromechanical systems device. An electrode over a substrate is provided. A movable layer is formed over the electrode. A mechanical layer is formed over the movable layer. A conductive layer is deposited between the electrode and the mechanical layer. A portion of the conductive layer forms at least a part of an electrical interconnect between circuitry outside the device and at least one of the electrode and the movable layer.

In another embodiment, a microelectromechanical systems device is provided. The device includes an electrode, a movable layer, a mechanical layer over the movable layer, a cavity between the electrode and the movable layer, and an electrical interconnect between circuitry outside the device and at least one of the electrode and the movable layer. At least a portion of the electrical interconnect and the movable layer are formed from a same material.

According to another embodiment, a method is provided for forming a microelectromechanical systems device. An electrode is provided. A conductive material is deposited over the electrode. A movable layer is deposited over the conductive layer. A mechanical layer is deposited over the movable layer. The conductive material forms at least a portion of an electrical interconnect between circuitry outside the device and one of the electrode and the movable layer. After the mechanical layer is deposited, the conductive material is selectively removed to form an optical cavity.

BRIEF DESCRIPTION OF THE DRAWINGS

These and other aspects of the invention will be readily apparent from the following description and from the appended drawings (not to scale), which are meant to illustrate and not to limit the invention, and wherein:

FIGS. 8A-8L are cross sections showing a process for making an embodiment of an interferometric modulator.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

According to embodiments described herein, a microelectromechanical systems (MEMS) device is provided. The device includes an electrical interconnect between circuitry outside the device and at least one of an electrode and a movable reflective layer within the device. At least a portion of the electrical interconnect is formed from the same material as a conductive layer between the electrode and a mechanical layer of the device. In an embodiment, this conductive layer is a sacrificial layer that is subsequently removed from the region of the MEMS device to form a cavity between the electrode and the movable reflective layer. The sacrificial layer is preferably formed of molybdenum, doped silicon, tungsten, or titanium. According to another embodiment, the conductive layer is a movable reflective layer that preferably comprises aluminum.

Figure 1:
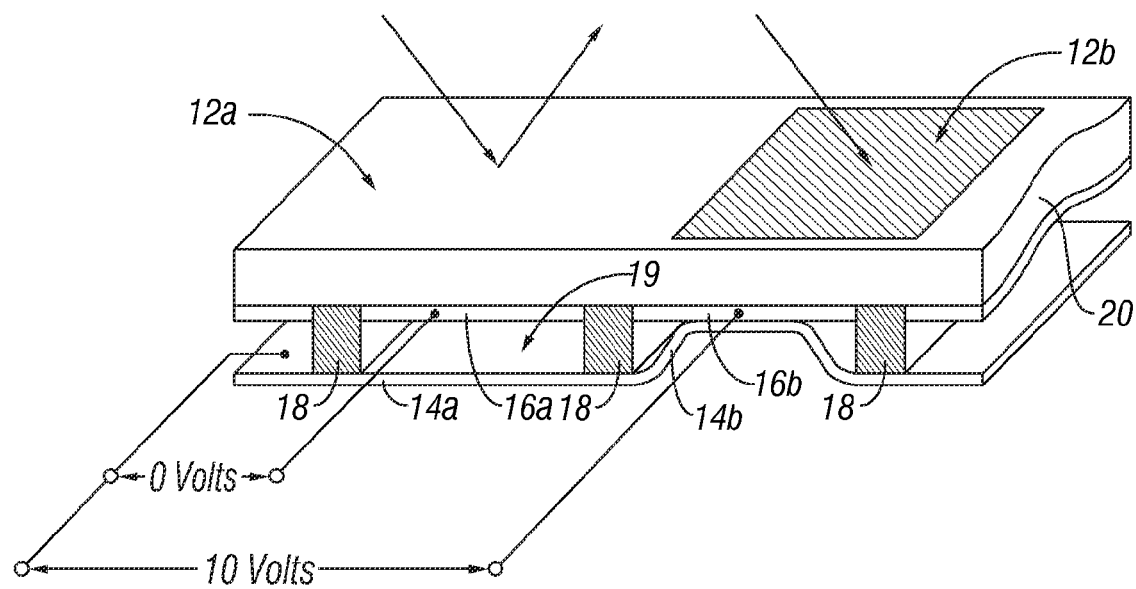
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
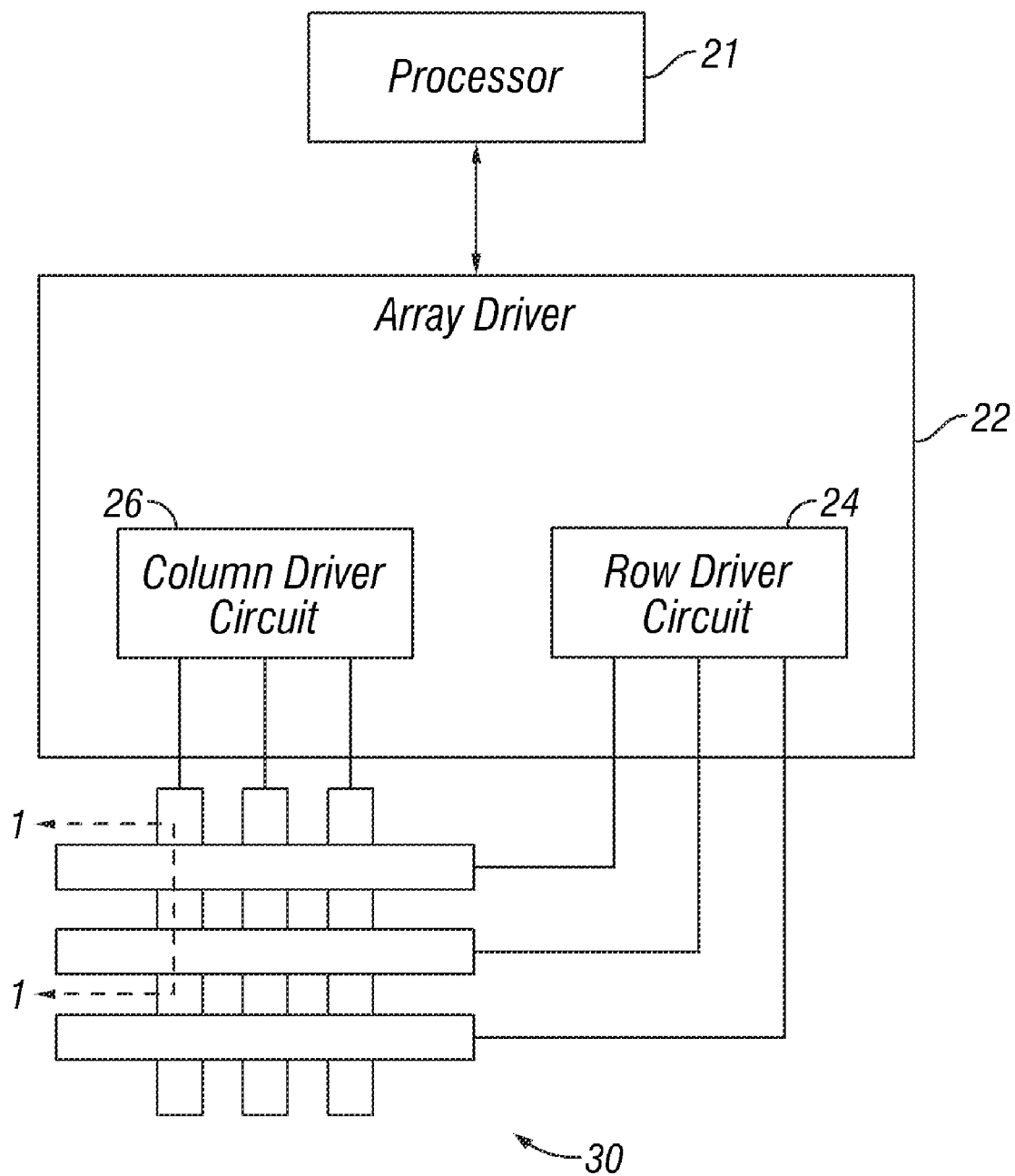
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
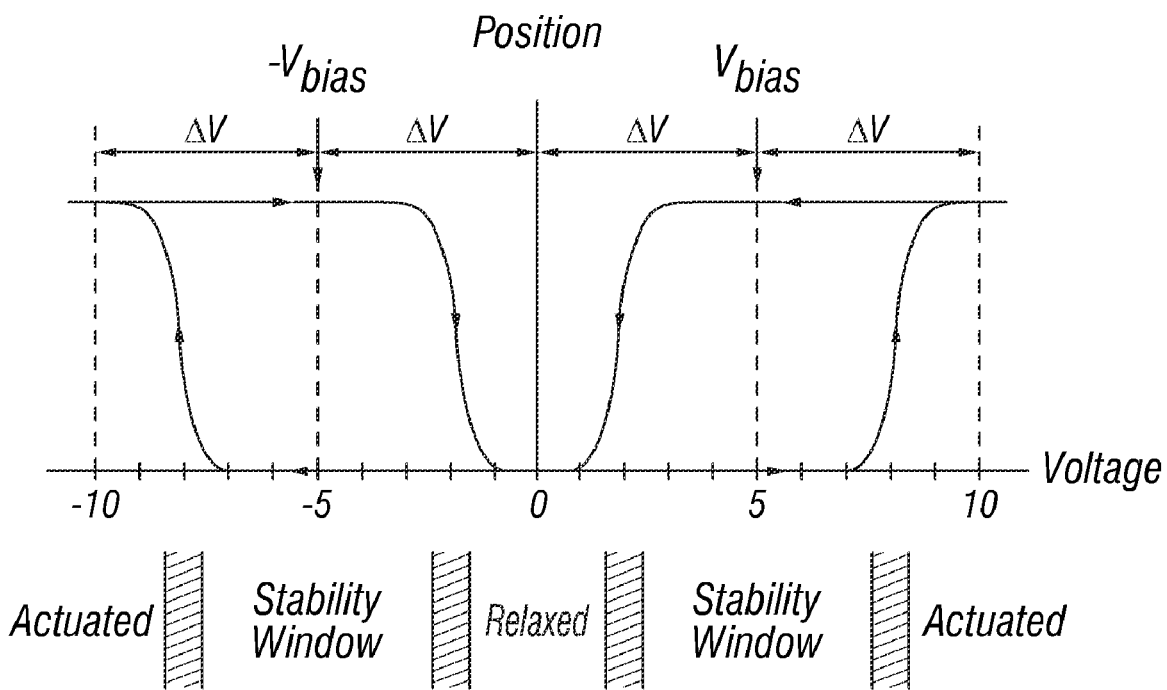
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
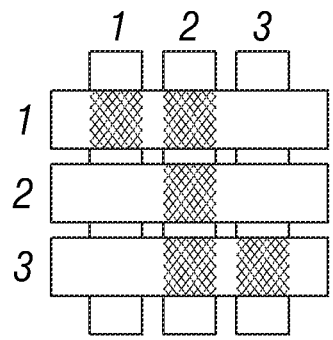
FIGS. 5A and 5B illustrate one exemplary timing diagram for row and column signals that may be used to write a frame of display data to the 3×3 interferometric modulator display of FIG. 2.
Figure 5B:
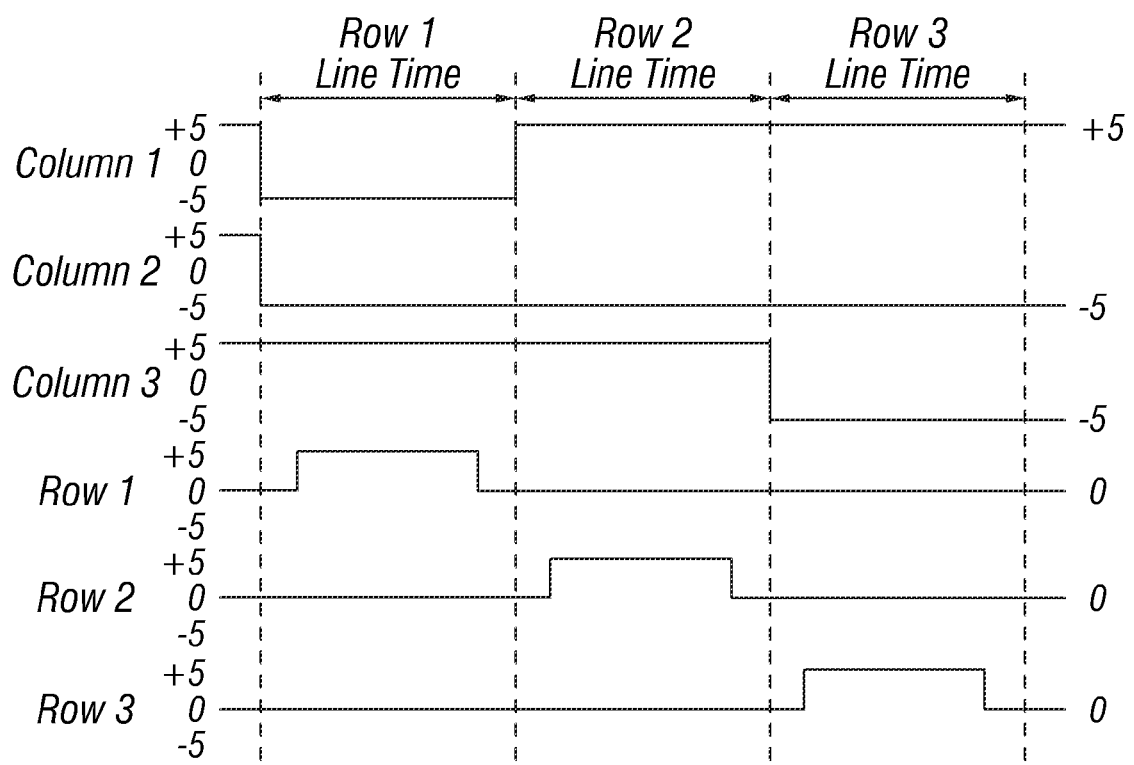

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than, those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
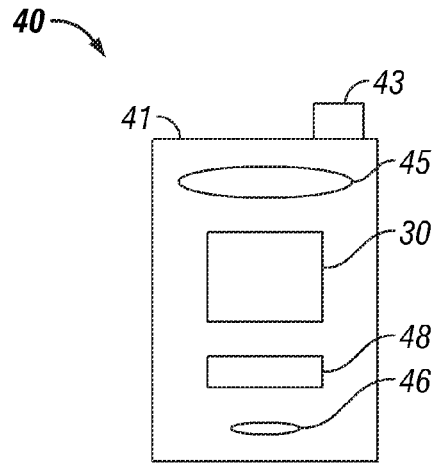
FIGS. 6A and 6B are system block diagrams illustrating an embodiment of a visual display device comprising a plurality of interferometric modulators.
Figure 6B:
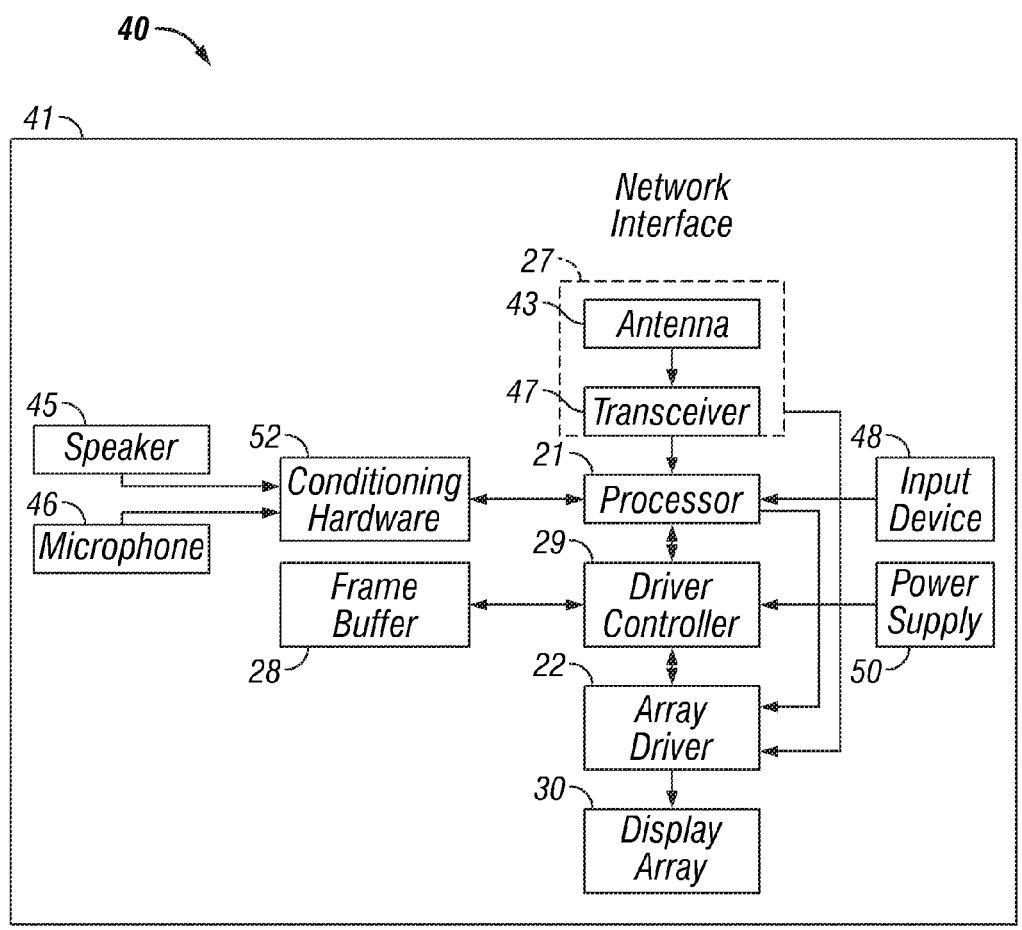

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
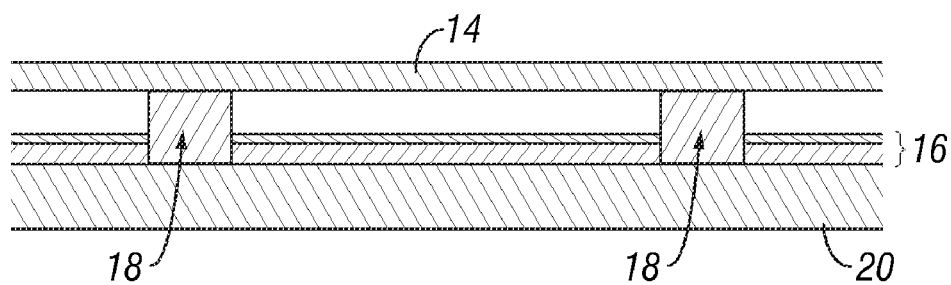
FIG. 7A is a cross section of the device of FIG. 1.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. The supports 18 can comprise isolated posts or continuous walls. For example, the supports 18 can include linear rails that support crossing strips of mechanical or movable material, and/or isolated posts. In one example, rails provide primarily support and posts within each cavity serve to stiffen the mechanical layer.

Figure 7B:
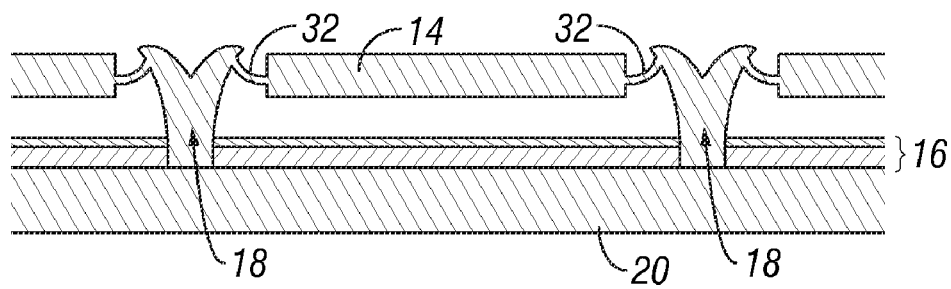
FIG. 7B is a cross section of an alternative embodiment of an interferometric modulator.
Figure 7C:
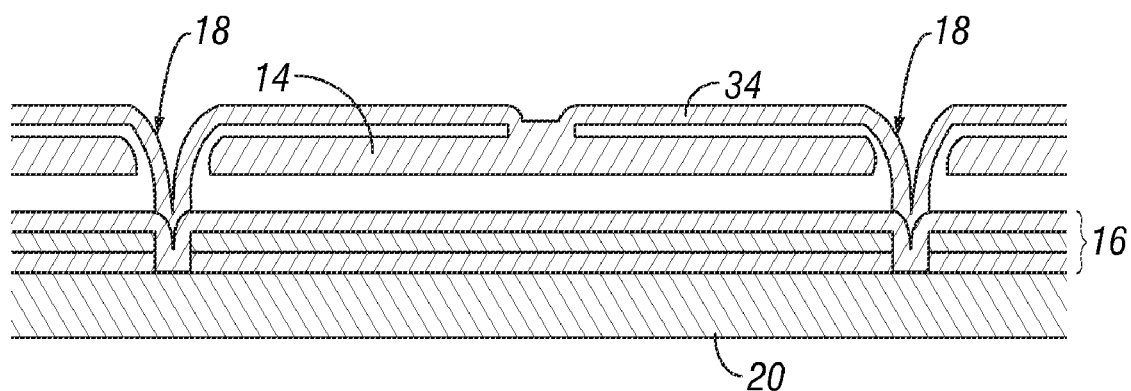
FIG. 7C is a cross section of another alternative embodiment of an interferometric modulator.

In FIG. 7B, the moveable reflective layer 14 is attached to supports at the corners only, on tethers 32. In FIG. 7C, the moveable reflective layer 14 is suspended from a deformable mechanical layer 34, which may comprise a flexible metal. The deformable mechanical layer 34 connects, directly or indirectly, to the substrate 20 around the perimeter of the deformable mechanical layer 34. These connections are herein referred to as support structures or supports 18. The embodiment illustrated in FIG. 7D has supports 18 that include post plugs 42 upon which the deformable layer 34 rests. The movable reflective layer 14 remains suspended over the gap, as in FIGS. 7A-7C, but the mechanical layer 34 does not form the support posts by filling holes between the mechanical layer 34 and the optical stack 16. Rather, supports 18 are separately deposited under the mechanical layer 34. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7A-7E, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable mechanical layer 34. This allows the structural design and materials used for the reflective layer 14 to be optimized with respect to the optical properties, and the structural design and materials used for the deformable layer 34 to be optimized with respect to desired mechanical properties.

Layers, materials, and/or other structural elements may be described herein as being "over," "above," "between," etc. in relation to other structural elements. As used herein, these terms can mean directly or indirectly on, over, above, between, etc., as a variety of intermediate layers, material, and/or other structural elements can be interposed between structural elements described herein. Similarly, structural elements described herein, such as substrates or layers, can comprise a single component or material or a multi-component structure (e.g., a laminate comprising multiple layers of the recited material, with or without layers of additional materials). Use of the term "one or more" with respect to an object or element does not, in any way, indicate the absence of a potential plural arrangement of objects or elements for which the term is not used. The term "microelectromechanical device," as used herein, refers generally to any such device at any stage of manufacture.

Methods disclosed herein employ depositions of conductive layers for use in the MEMS array to simultaneously form peripheral electrical interconnect or routing. In some options for forming a microelectromechanical system (e.g., an interferometric modulator) such as that of the embodiment shown in FIG. 7A, depositions that form the deformable mechanical layer 34 and/or the electrodes of the optical stack 16, can also be used to provide electrical interconnect and routing in the periphery of the display, where the interconnect is between circuitry outside the array (e.g., an output from a driver chip at a contact pad) and an electrode (row, column, or bias electrode) within the array. However, the materials typically used for the mechanical layer 34 and the electrodes of the optical stack 16 are generally optimized for a MEMS device and are not necessarily ideal for electrical interconnect purposes. The mechanical layer 34, which, in some embodiments, includes a layer of nickel, and the electrodes of the optical stack 16, which may be formed of indium tin oxide (ITO) and molybdenum chromium (MoCr) or chromium (Cr) over the ITO, have relatively low conductivity and/or are susceptible to degeneration (corrosion or bridging) when exposed to ambient conditions, such as, for example, humidity. For example, the mechanical layer 34 can be exposed to humidity at the top surface of array glass around the periphery of the interferometric modulator array where it is not protected by the backplate or seal. An additional layer of a suitable material is preferably deposited over the mechanical layer 34 to protect it from the surrounding environment. The electrodes of the optical stack 16, although mostly protected by dielectric material, may become exposed to the environment, particularly where they cross the scribe and break lines at the edge of the display. The scribe lines are where individual MEMS devices or arrays are divided from others simultaneously fabricated on a larger substrate, much the same way individual IC chips are diced from larger wafers.

The sheet resistances of the materials typically used for the mechanical layer 34 and electrodes of the optical stack 16 are often relatively high and reducing the resistance would typically come at the cost of degraded optical or electromechanical characteristics of the interferometric modulator. The sheet resistance properties of the metal mechanical layer 34 generally limit the minimum line width that can be used in the periphery of the display, thereby limiting the interconnect density and setting a lower limit of the display periphery width. As display sizes increase and as update rates increase, a lower resistance interconnect material becomes increasingly desirable.

Typically, in IC or MEMS technologies, the top metal interconnect layer is protected by a passivation layer formed from a dielectric material, such as silicon dioxide or silicon nitride, covering the metal layer. The addition of the passivation layer generally requires additional deposition and masking steps, thereby adding to the complexity and cost of fabrication of the device. Alternatively, an organic material (e.g., polyimide) may be screen-printed or otherwise deposited and patterned over the interconnect region. In such structures having an organic top coat, contaminants may become trapped below the underlying layers, leading to damage over the long term, and the organic top coat layer is generally less effective than inorganic passivation layers at providing consistent environmental protection.

During fabrication of an interferometric modulator, after a seal has been applied to adhere a backplate to the transparent substrate (e.g., substrate 20 in FIGS. 7A-7E), the interferometric modulator structure may be mechanically or laser scribed or otherwise prepared for division into individual interferometric modulator package structures or arrays. It is common practice to use a suitable conducting material to connect the array electrodes to shorting bars for protection against damage caused by electro-static discharge (ESD) during manufacturing. The shorting bar or bars are typically removed before final assembly and are often located on the opposite side of a scribe line from the array. Thus, when the glass plate is cut into individual panels, the shorting bars are automatically removed from the array. The material used for electrodes in the optical stack 16 may be used to connect the array electrodes to the shorting bar(s). It is preferably protected by the optical stack dielectric 17 (e.g., FIG. 8L) and post dielectric 62 (e.g., FIG. 8L) in the array periphery but becomes exposed at the scribed or cut edges of the glass. The electrodes of the optical stack 16 at the scribed edges may be protected by applying a suitable material (e.g., epoxy) during the final assembly step of fabrication process. Alternatively, an environmentally stable conductor may be used where the conducting material of the electrodes is exposed. An example of such an environmentally stable conductor is, for example, a refractory metal (e.g., molybdenum, tungsten, tantalum). As will be described in more detail below, such a conducting material may also be used as a sacrificial material.

Figure 8A:
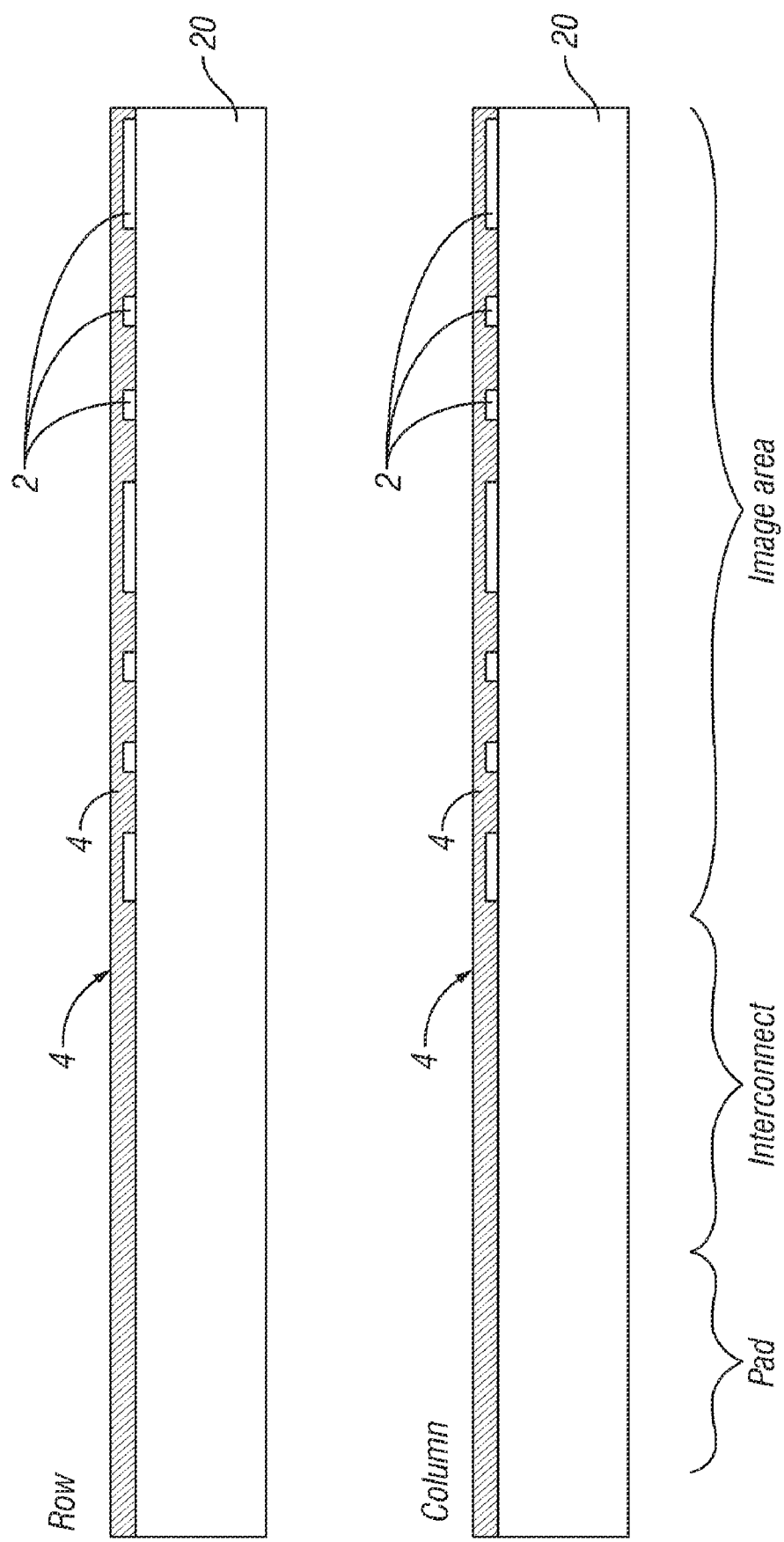

FIGS. 8A-8L describe an exemplary process for manufacturing a device that utilizes a single deposited layer of a conductive material to form a cavity and an interconnect structure. Each figure illustrates a cross-sectional view (top cross-sectional view) of the device along the length of a row electrode and another cross-sectional view (bottom cross-sectional view) along the length of a column electrode. With reference to FIG. 8A, to form the interferometric modulator, the transparent substrate 20 in one embodiment is covered with ITO. The skilled artisan will appreciate that before the ITO is deposited on the transparent substrate 20, a dark matrix deposition may be performed by depositing, masking, and etching a layer of a dark mask 2 (e.g., MoCr). This layer acts with the deposited dielectric material 4 and the ITO and MoCr forming the first electrode of the interferometric modulator to create a low-reflecting structure by optical interference. Thus, the structure can be used to minimize reflections from the unswitched parts of the pixel. As shown in FIG. 8A, if the dark matrix deposition is performed, a dielectric material 4, such as silicon dioxide ($SiO_2$), is deposited over the structure before the ITO is deposited.

The ITO may be deposited by standard deposition techniques, including chemical vapor deposition (CVD) or sputtering. A relatively thin layer of MoCr or Cr is preferably deposited over the ITO. The ITO and MoCr or Cr are then etched and patterned into rows to form the electrodes of the optical stack 16, as shown in FIG. 8B. The optical stack 16 includes a dielectric layer 17 (e.g., silicon dioxide ($SiO_2$)), as shown in FIG. 8C, to provide electrical isolation during operation between the row electrodes and subsequently deposited column electrodes. Alternatively, the silicon dioxide may be covered with an aluminum oxide ($Al_2O_3$) cap layer to protect it from the release etch performed later in the fabrication sequence. The dielectric layer 17 (e.g., $SiO_2$ or silicon oxide and aluminum oxide layers) is patterned and etched in certain areas (e.g., via 31 in FIG. 8D) to allow a conductive material 60 that also forms a sacrificial layer (deposited later, as described below) to contact the ITO of the optical stack 16, as shown in FIG. 8E.

Figure 8D:
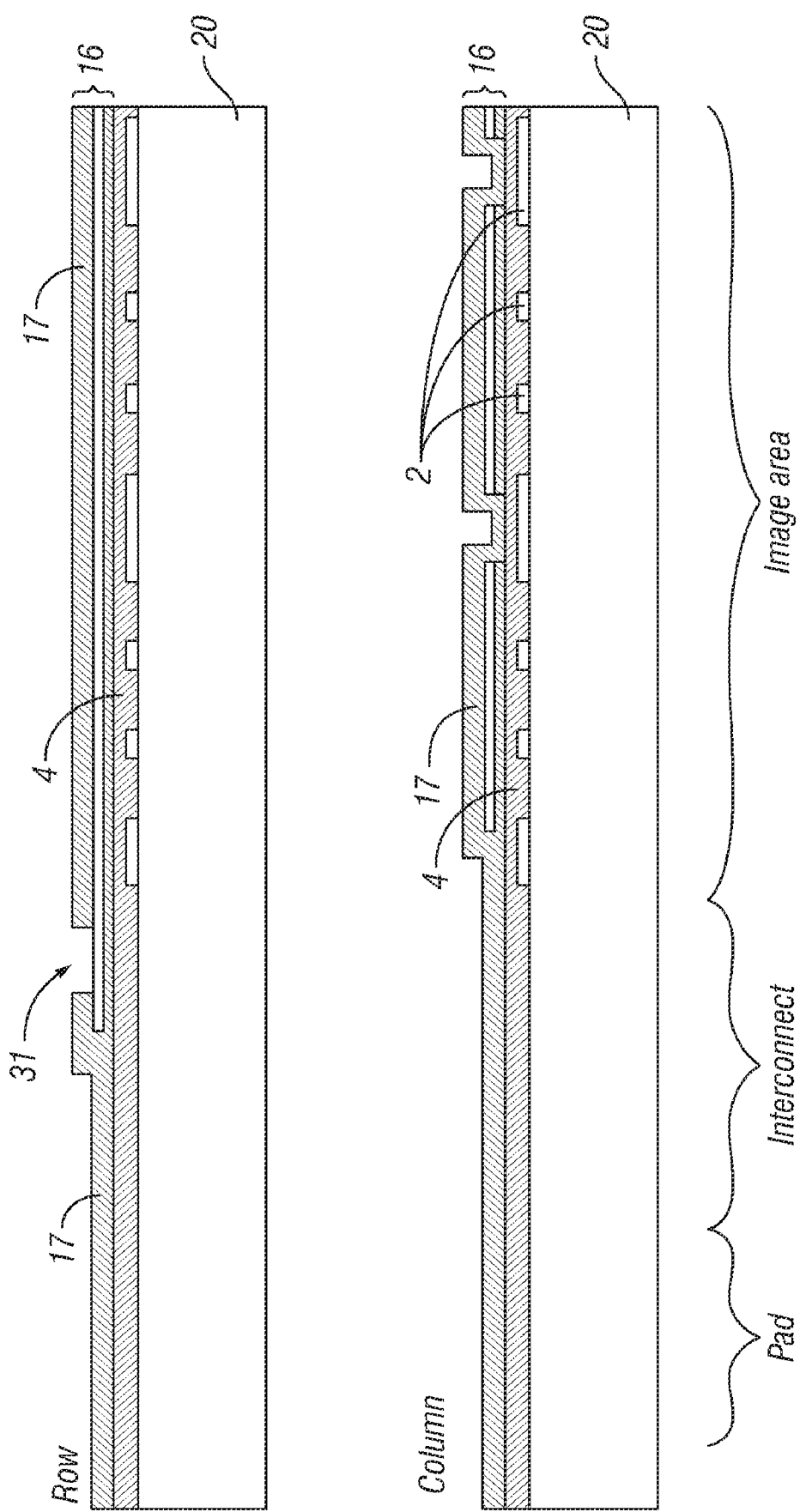
Figure 8E:
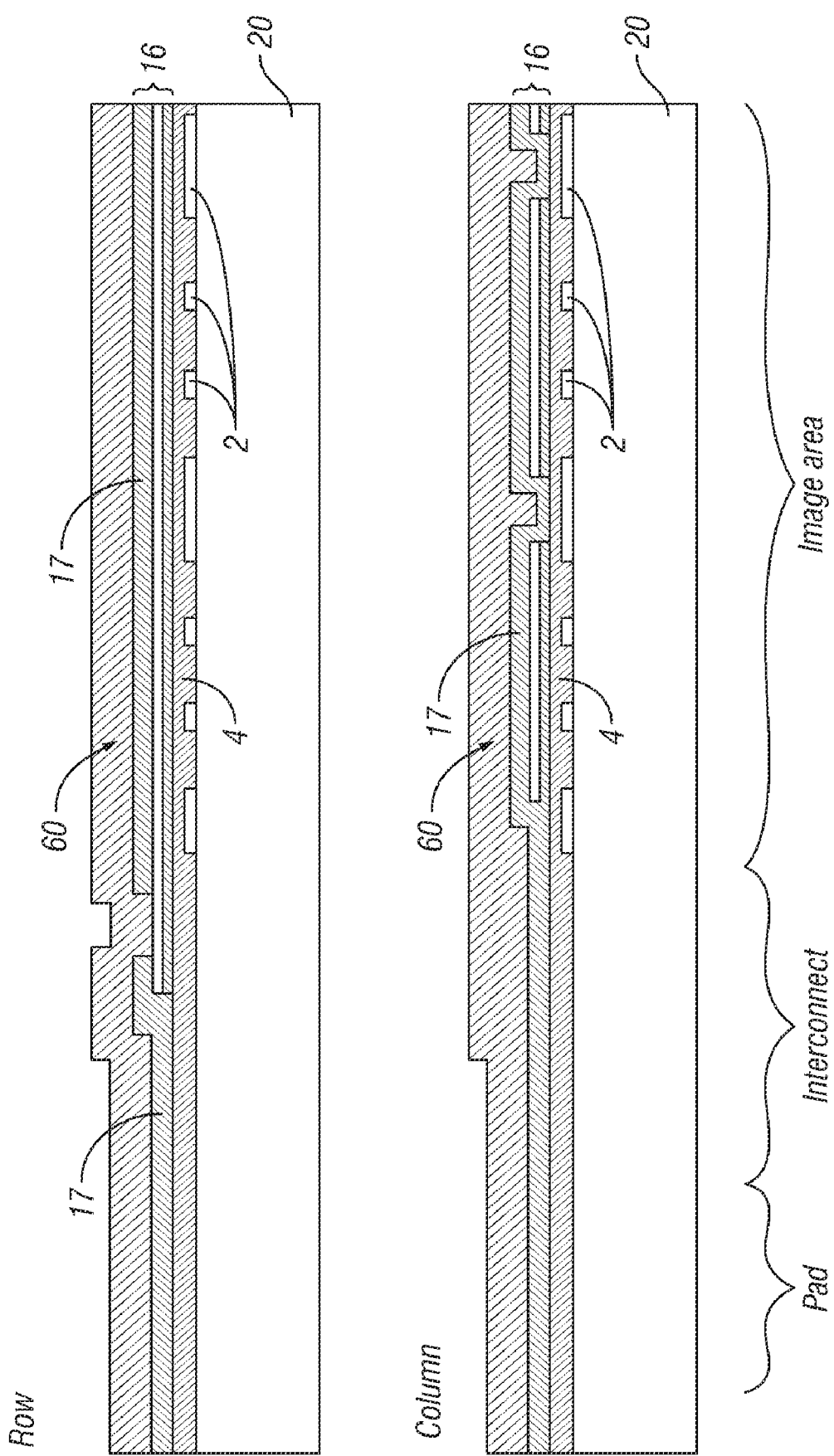

As shown in FIG. 8E, the conductive material 60, preferably comprising molybdenum (Mo) is deposited (and later partially removed) over the structure. This material 60 is used both to create at least a portion of the electrical interconnect structures and to form at least one resonant optical cavity 19 (see FIGS. 8K and 8L) between the electrodes of the optical stack 16 and the movable layer 14 (which will be deposited, as described below with respect to FIGS. 8I-8L). As will be described in more detail below, the interconnect structures electrically connect circuitry on a contact pad outside the array with either the row electrode (e.g., ITO of the optical stack 16) or the movable layer 14 or both. In other embodiments, this conductive material 60 may comprise, for example, doped silicon, tungsten (W), or titanium (Ti). The skilled artisan will understand that the conductive material 60 is preferably selectively etchable, relative to the dielectric 17 and other exposed metals of the interferometric modulator. Alternatively, silicon can be deposited as the conductive material 60 and is doped for conductivity in the interconnect area. The skilled artisan will appreciate that silicon can be used as a sacrificial material, but is preferably doped for electrical interconnect/routing purposes. It will be understood that, as used in connection with this embodiment, the term "conductive material" means the material that is used to form the "sacrificial layer" that is subsequently removed and that only the portions of the "conductive material" that form the "sacrificial layer" are selectively removed in a release etch.

As discussed above, an interferometric modulator is configured to reflect light through the transparent substrate and includes moving parts, such as the movable layer 14. Therefore, to allow such moving parts to move, a gap or cavity 19 (as illustrated in FIG. 8K) is preferably created between the electrodes of the optical stack 16 and the movable layer 14 by selectively removing the conductive material 60 forming the sacrificial layer in the image (or "array" or "display") area to create the cavity 19, which will be described in more detail below. The gap or cavity 19 allows the mechanical parts, such as the movable layer 14, of the interferometric modulator to move.

Figure 8F:
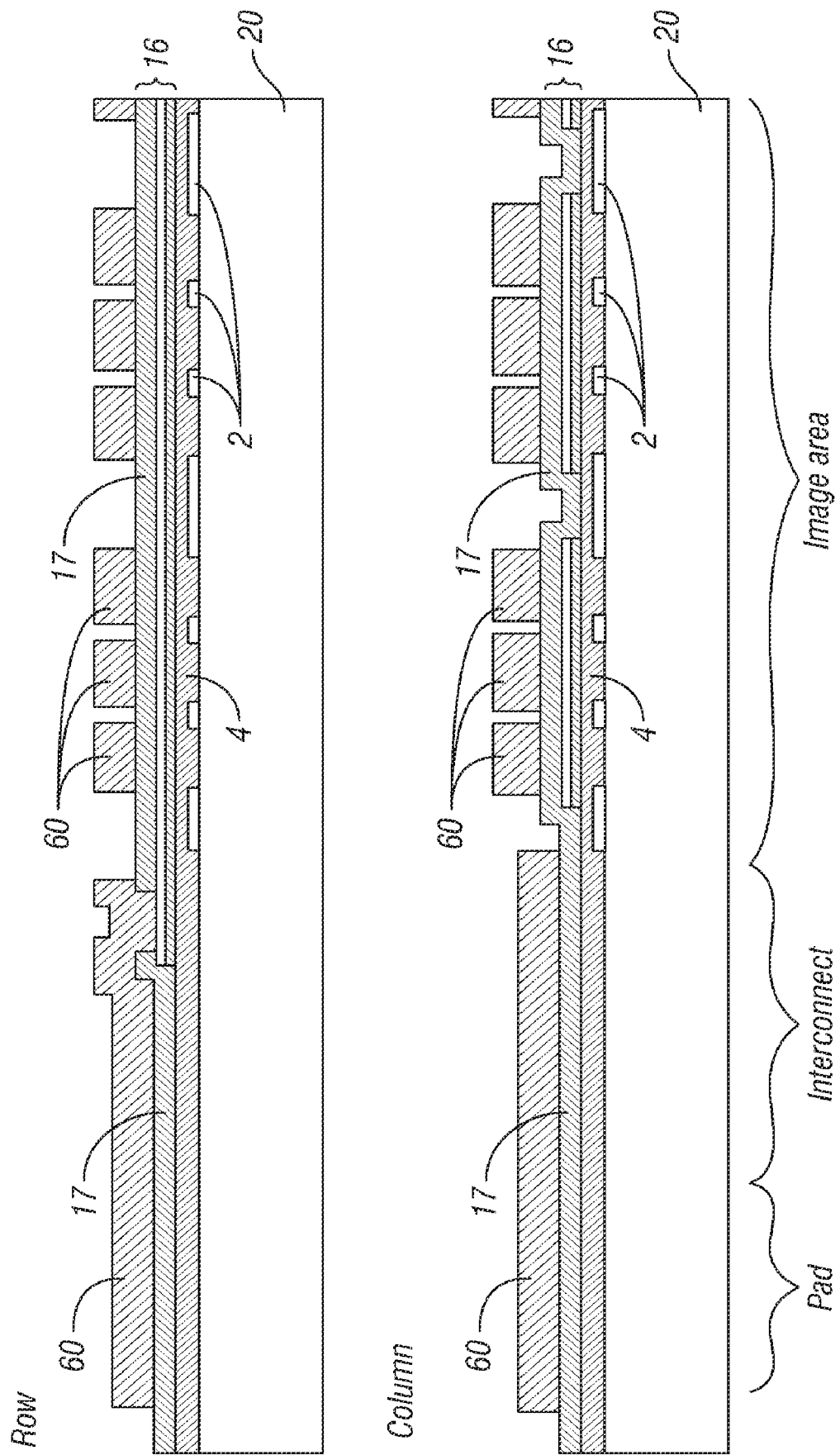

The layer of conductive material 60 is preferably patterned and etched over the electrodes 16, as shown in FIG. 8F. The conductive material 60 is patterned and etched in order to form vias for support structures (the deposition of which will be described below) in the display or image area of the device, as shown in FIG. 8F. At the same time, the conductive material 60 is patterned in the peripheral areas to form the interconnect or routing, as shown in FIG. 8F.

Figure 8G:
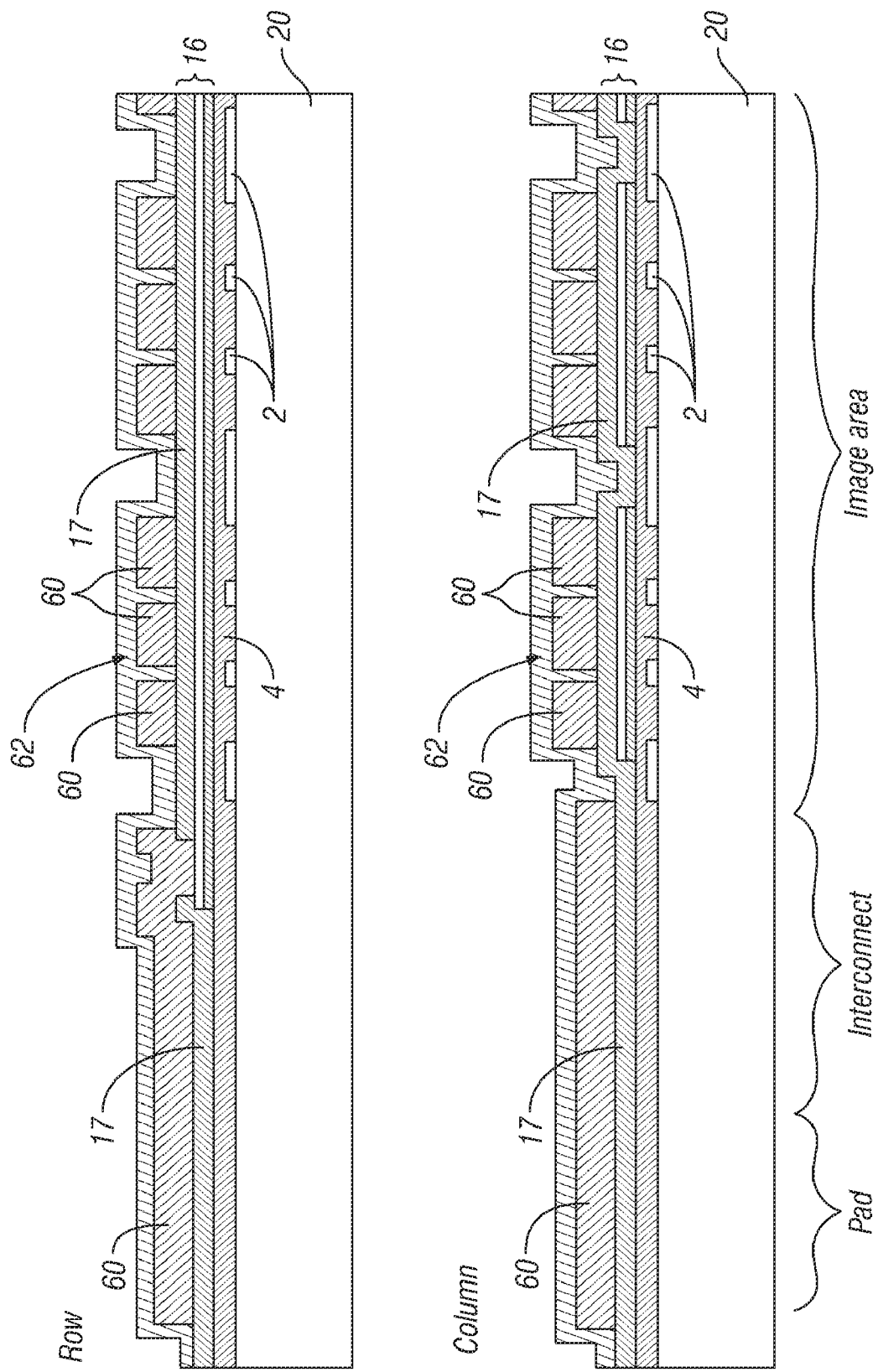
Figure 8H:
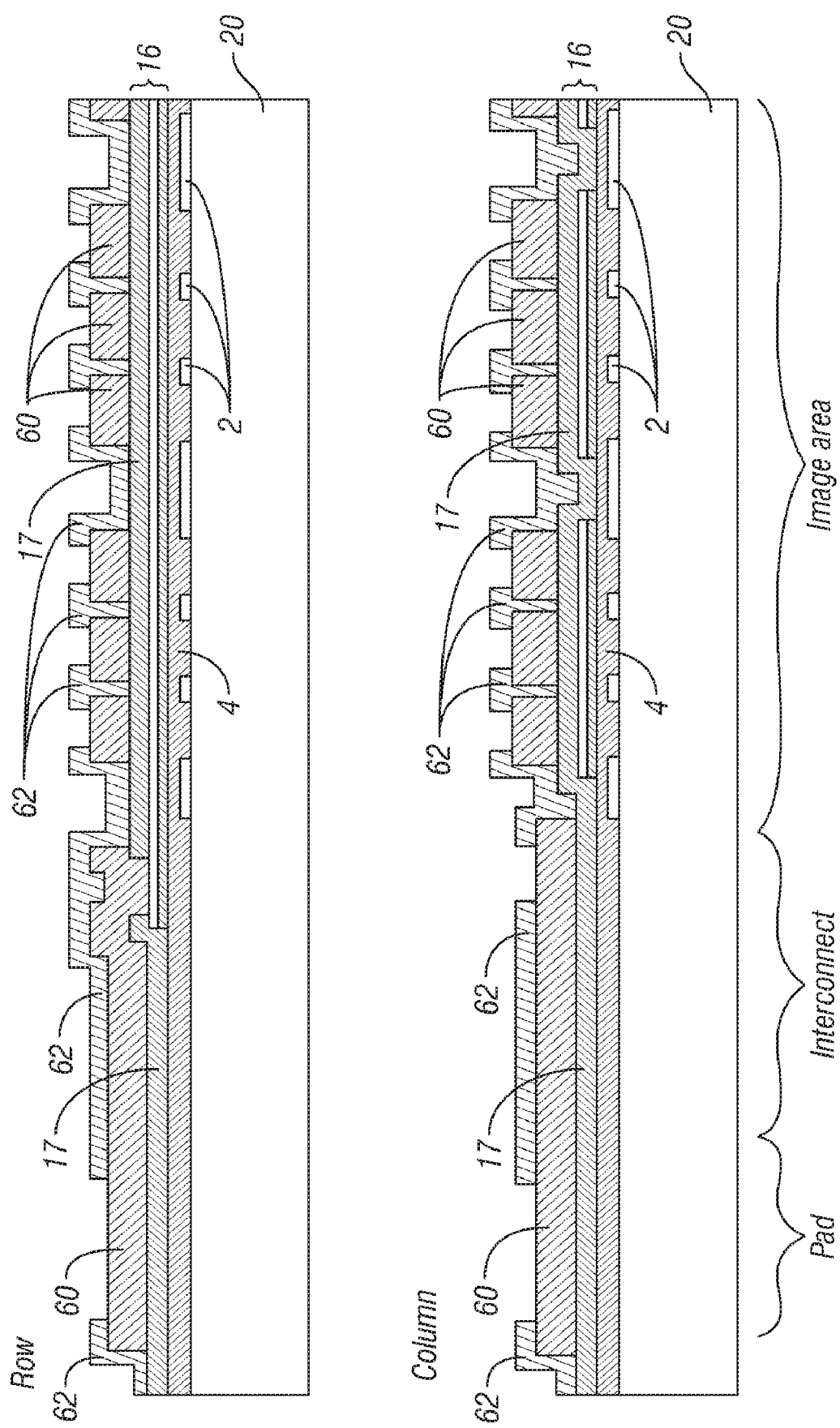

After patterning and etching the conductive material 60, a support layer 62, preferably formed of an insulating material such as silicon dioxide ($SiO_2$), is deposited over the entire structure, as shown in FIG. 8G. The support layer 62 is then patterned and etched to form support structures or posts in the array area, as shown in FIG. 8H. The skilled artisan will appreciate that some of the support layer 62 covers the conductive material 60 in the routing/interconnect areas and serves as a protective layer, encapsulating and protecting the conductive material 60 in the periphery from the release etch, which will be described in more detail below. In "pad" portions, the support layer 62 is patterned to form contact openings, as shown in on the left side of FIG. 8H. The skilled artisan will appreciate that these contacts may be formed either prior to or after a release etch, which will be described below.

Figure 8I:
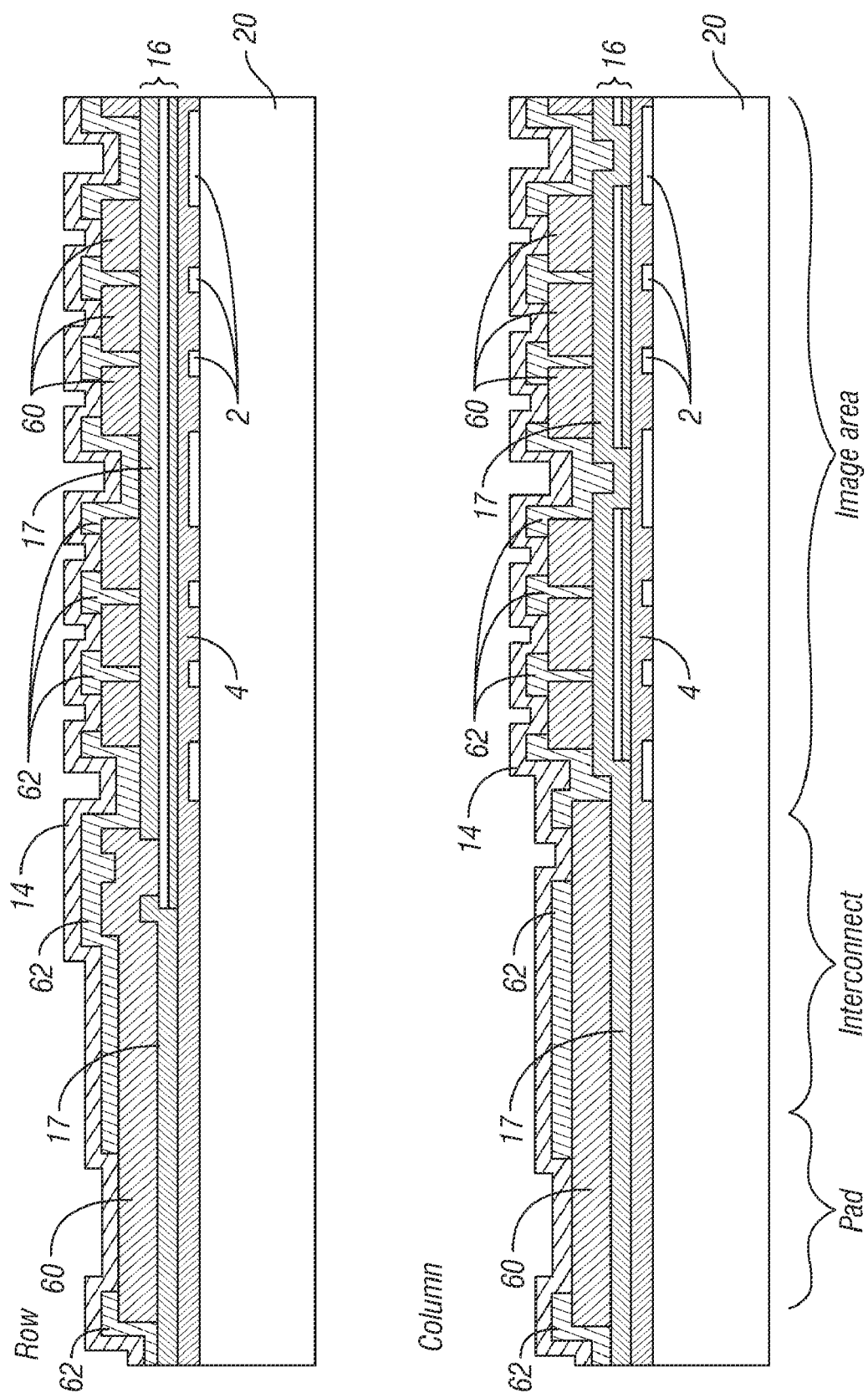
Figure 8J:
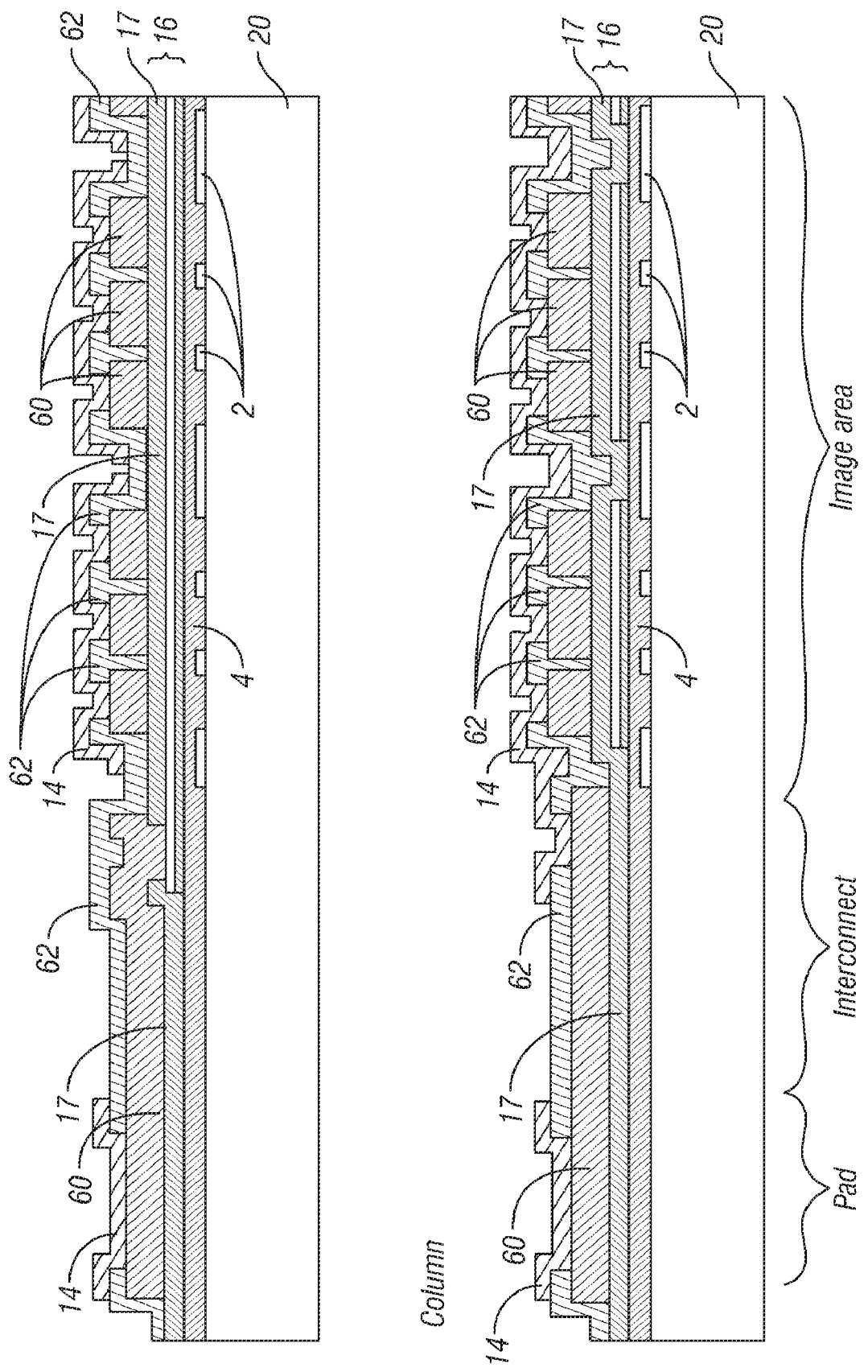
Figure 8K:
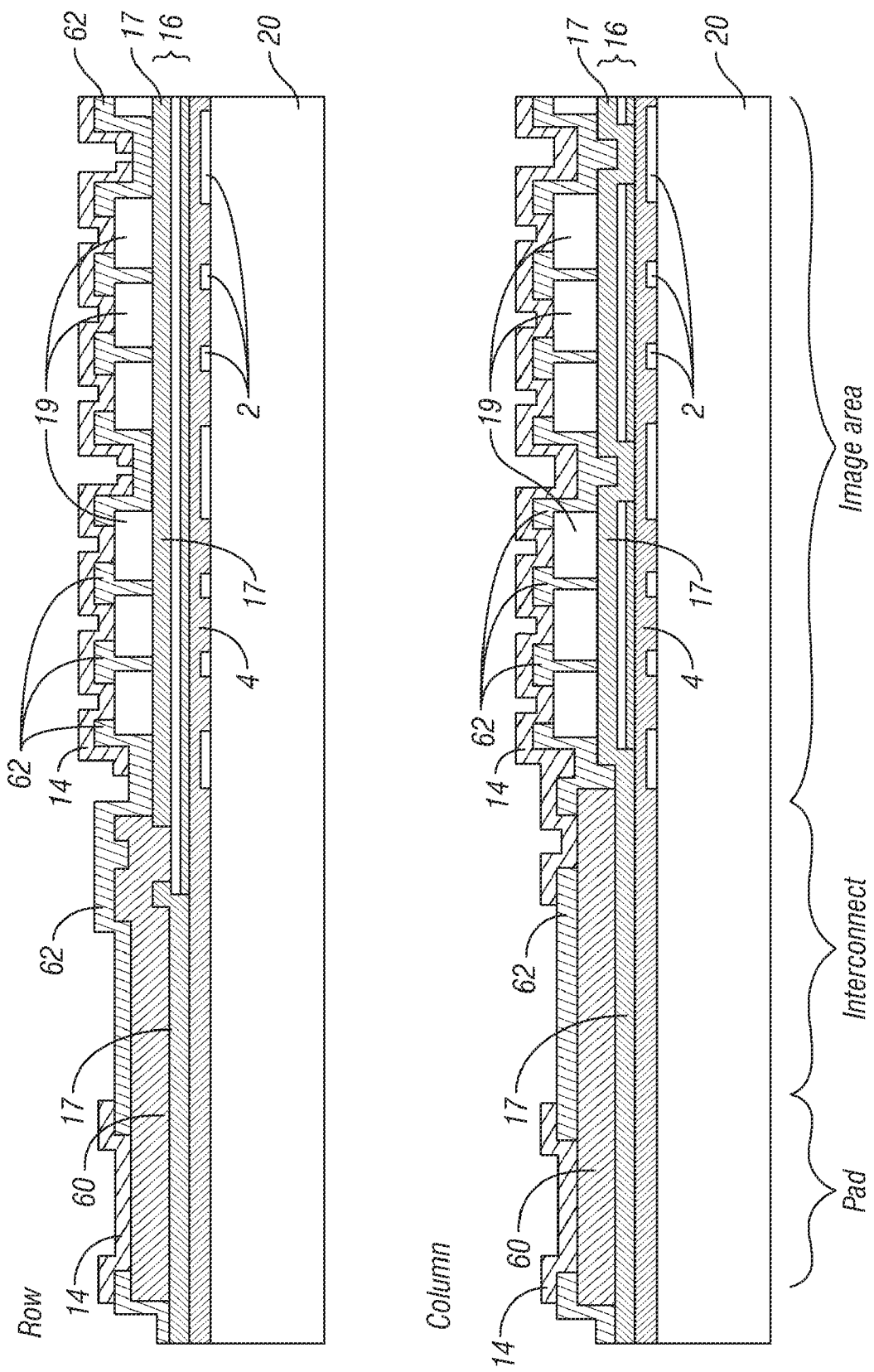

As shown in FIG. 8I, the movable metal layer 14 is deposited over the entire structure to form the movable electrodes/mechanical layer 14 of the interferometric modulator. As noted above, the illustrated movable layer 14 is formed of nickel over aluminum. In other embodiments, the movable layer is formed of aluminum. This movable layer 14 is deposited and patterned into columns orthogonal to the row electrodes of the optical stack 16 to create the row/column array described above. The movable layer 14 is patterned and etched, as shown in FIG. 8J. The skilled artisan will appreciate that small holes (not shown) are preferably etched in portions of the movable layer 14 that are over areas of the sacrificial layer comprising the molybdenum conductive material 60 to be removed by the release etch (in the image or display area). It will be understood that the movable layer 14 is also used to form a contact to the ITO of the optical stack 16 through the conductive material 60 in the "pad" region.

The aluminum (of the movable layer 14) to ITO (of the electrodes of the optical stack 16) electrical contact structure can be made stable and reliable by adding a barrier formed of a refractory metal, such as the conductive material 60 (e.g., molybdenum, tungsten, or tantalum, or a suitable alloy), between the aluminum and ITO. Typically, the barrier metal is at least 40 nm thick. The skilled artisan will understand that the barrier metal is desirable because the layer of Cr or MoCr over the ITO in the optical stack 16 of the interferometric modulator is typically only about 7 nm thick and may be removed entirely during the process step that forms the contact cuts 31 (FIG. 8D). Even if it does survive intact, it is too thin to provide adequate long-term reliability. The skilled artisan will appreciate that this refractory metal material forming the barrier can also be used for an electrical interconnect as well as a sacrificial layer, as will be described in more detail below.

The exposed areas of the sacrificial layer 60 are removed in a release etch, after the movable layer 14 is formed, to create the optical cavity 19 between the fixed electrodes of the optical stack 16 and the movable layer 14 in the display or image area, as shown in FIG. 8K. Standard release techniques may be used to remove the sacrificial layer 60. The particular release technique will depend on the material to be removed. For example, xenon difluoride ($XeF_2$) may be used to remove a molybdenum (illustrated), tungsten, or silicon sacrificial layer.

The layer formed of conductive material 60, such as, for example, molybdenum, is provided as an electrical interconnect as well as serving as a barrier layer between the movable layer 14 and the electrodes of the optical stack 16 just outside the image area. Additionally, the lower reflective aluminum layer of the illustrated movable layer 14 forms a poor and unreliable electrical contact with the ITO of the illustrated optical stack 16, and the illustrated sacrificial material 60 (molybdenum) improves both the contact resistance and reliability. Molybdenum may also be used for electrical contacts across scribe edges and is sufficiently resistant to corrosion that it may be left exposed at the edges. The layer 60 of conductive material is preferably about 150-200 nm and has low sheet resistance, preferably as low as or lower than that of the movable layer 14.

According to this embodiment, the skilled artisan will appreciate that the molybdenum peripheral routing/interconnect 60 is preferably encapsulated and protected from the release etch for forming the optical cavity 19, as described above. To protect the molybdenum peripheral routing 60 from the release etch, a suitable material (e.g., silicon dioxide or silicon nitride) is used for support structures 62 and is simultaneously patterned to protect the molybdenum peripheral routing 60 from the release etch. As shown in FIG. 8K, the molybdenum peripheral routing 60 (i.e., in the interconnect and pad regions) is encapsulated by portions of the support structure material 62 and the movable layer 14 such that it is protected from the release etch. The skilled artisan will appreciate that the release etchants are chosen to be selective such that the support structure material 62 and the movable layer 14 will not be removed by the release etch. As shown in FIG. 8K, the molybdenum 60 remains in areas where it is encapsulated to form the peripheral routing/interconnect and is etched to form the optical cavity 19 where it is exposed in the display or image area. It will be understood that, in the illustrated example, the thickness of the molybdenum layer 60 of interconnect/routing has some correspondence to the height of the optical cavity 19, as the interconnect/routing and the sacrificial layer are formed from a single deposited layer of conductive material 60. However, the cavity height will not equal the thickness of the molybdenum 60 in the interconnect, due to considerations such as additional height added by the launch angle influenced by the support structures 62.

The skilled artisan will understand that any pin-holes in the support structure material 62 may result in etching of the routing/interconnect molybdenum 60 during the release etch. To reduce the possibility of etching of the routing/interconnect molybdenum 60, the support structure material 62 may be made thicker to minimize pin-hole formation. Alternatively, in another embodiment, the inorganic support structure material 62 may be deposited in two steps, with a suitable cleaning step in between. The two layers in this embodiment are patterned together. The skilled artisan will appreciate that, in this embodiment, any pin holes in the two layers are unlikely to be coincident or aligned, thus minimizing risk that the routing/interconnect molybdenum 60 is etched during the release etch. In still another embodiment, another layer may be separately deposited and patterned over the routing/interconnect molybdenum 60 to provide additional protection from the release etch, or in place of the support layer 62, in the peripheral regions.

Figure 8L:
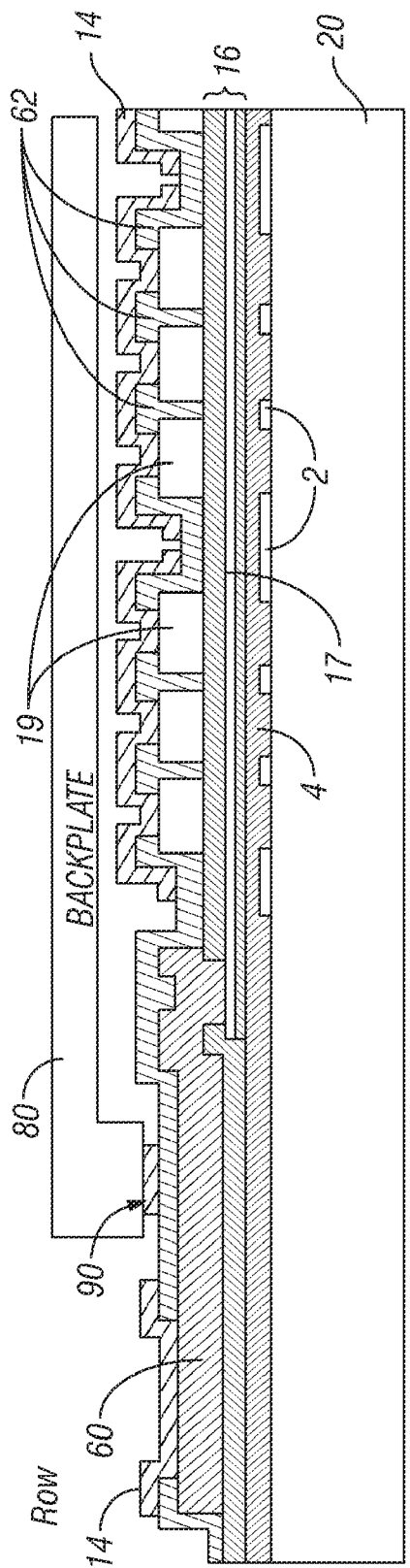
Figure 8L:
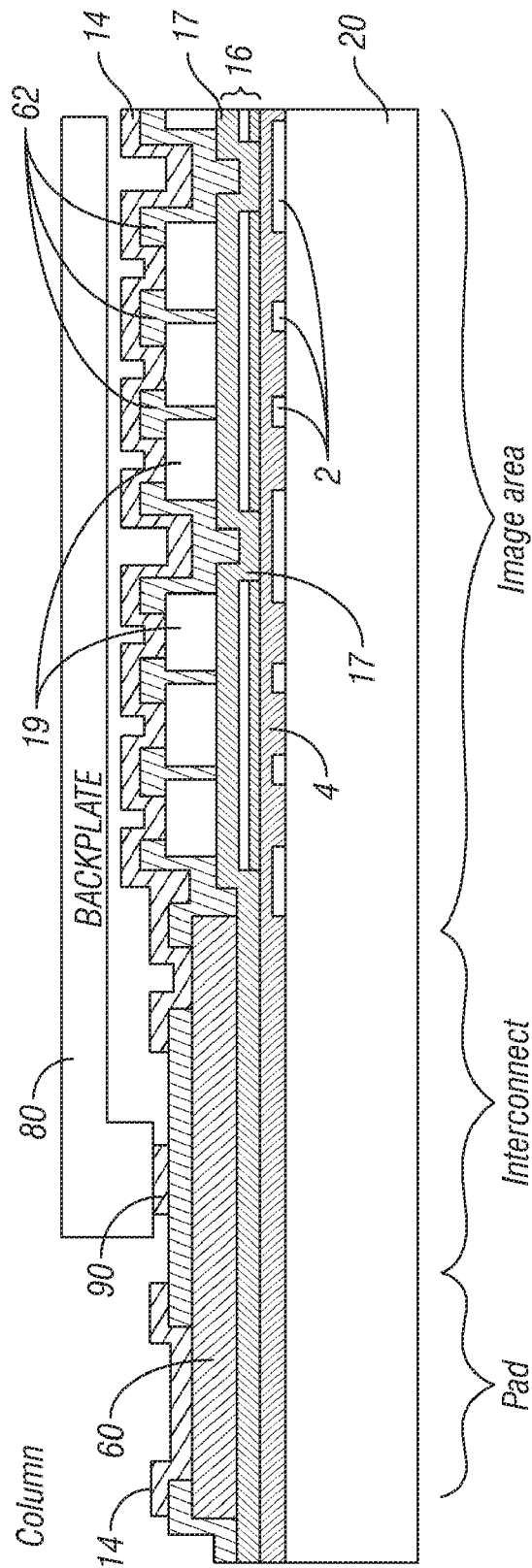

After the release etch, a backplate 80 is preferably sealed to the transparent substrate 20 using a seal 90 to protect the display area of the interferometric modulator. As shown in FIG. 8L, the seal 90 is in the area of the molybdenum peripheral routing/interconnect 60 and the conductive material 60 extends under the seal 90 and leads to contact pads in the "pad" region where row/column drivers are mounted. The skilled artisan will appreciate that contacts from the movable layer 14 to the conductive material 60 and from the conductive material 60 to the ITO of the optical stack 16 are in the sealed area of the array under the backplate 80.

The backplate 80 protects the MEMS device from harmful elements in the environment. Similarly, the seal 90 preferably provides a sufficient barrier for preventing water vapor and other contaminants from entering the package and damaging the MEMS device. The skilled artisan will understand that transparent substrate 20 may be any transparent substance capable of having thin film, MEMS devices built upon it. Such transparent substances include, but are not limited to, glass, plastic, and transparent polymers. Images are displayed through the transparent substrate 20.

Figure 9:
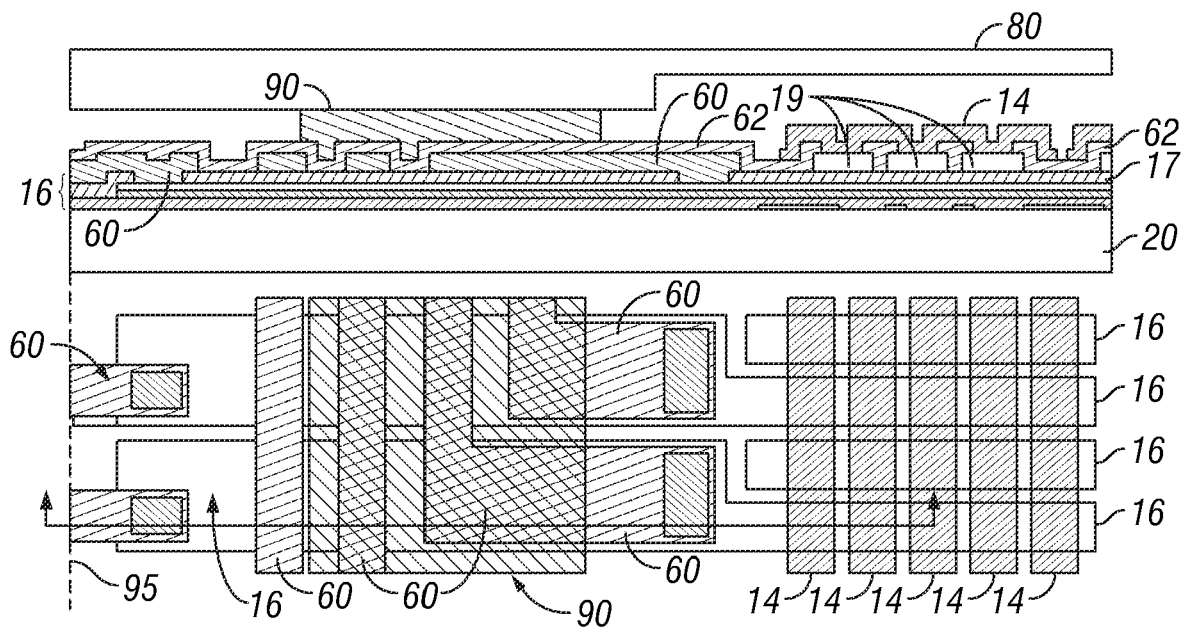
FIG. 9 shows a cross-section and top plan view of an embodiment of an interferometric modulator shown in FIGS. 8A-8L.
Figure 10:
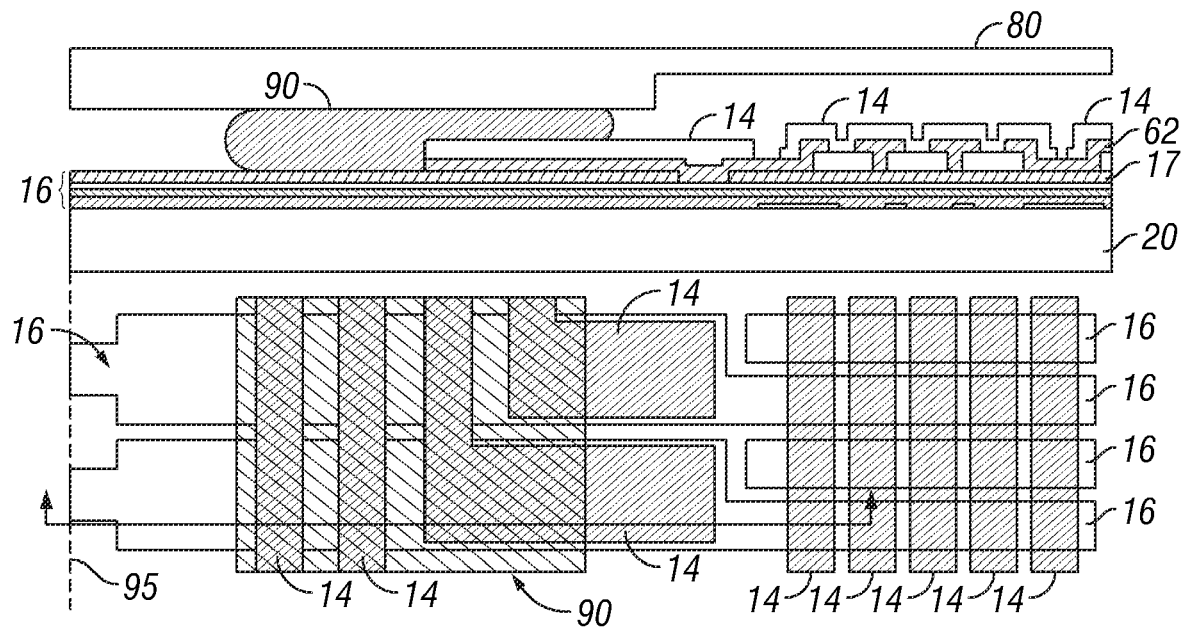
FIG. 10 shows a cross-section and top plan view of another embodiment of an interferometric modulator.

FIG. 9 shows a cross section along the length of a row patterned into the optical stack 16 and a top plan view of an embodiment of an interferometric modulator having interconnects/routing formed of a sacrificial material, such as molybdenum, as described above. A scribe line 95 is shown in FIG. 9. As shown in FIG. 9, the optical stack 16 and the movable layer 14 do not cross the scribe line 95 and are thus not exposed at the scribe line 95. The molybdenum interconnect/routing 60, which extends outside the seal 90, does cross the scribe line 95. For comparison, FIG. 10 shows a cross section along the length of a column patterned into the mirror layer 14 and top plan view of an embodiment of an interferometric modulator in which the movable layer 14 and electrodes of the optical stack 16 form the routing/interconnect. As shown in FIG. 10, the electrodes of the optical stack 16 cross the scribe line 95 and are thus exposed. Advantageously, the exposed refractory metal interconnect 60 of FIG. 9 better withstands exposure than the exposed optical stack 16 of FIG. 10. It will be understood that, for clarity, in the top plan view of FIGS. 9 and 10, certain features, such as the backplate 80 and the support structure material 62 are not shown.

Figure 11A:
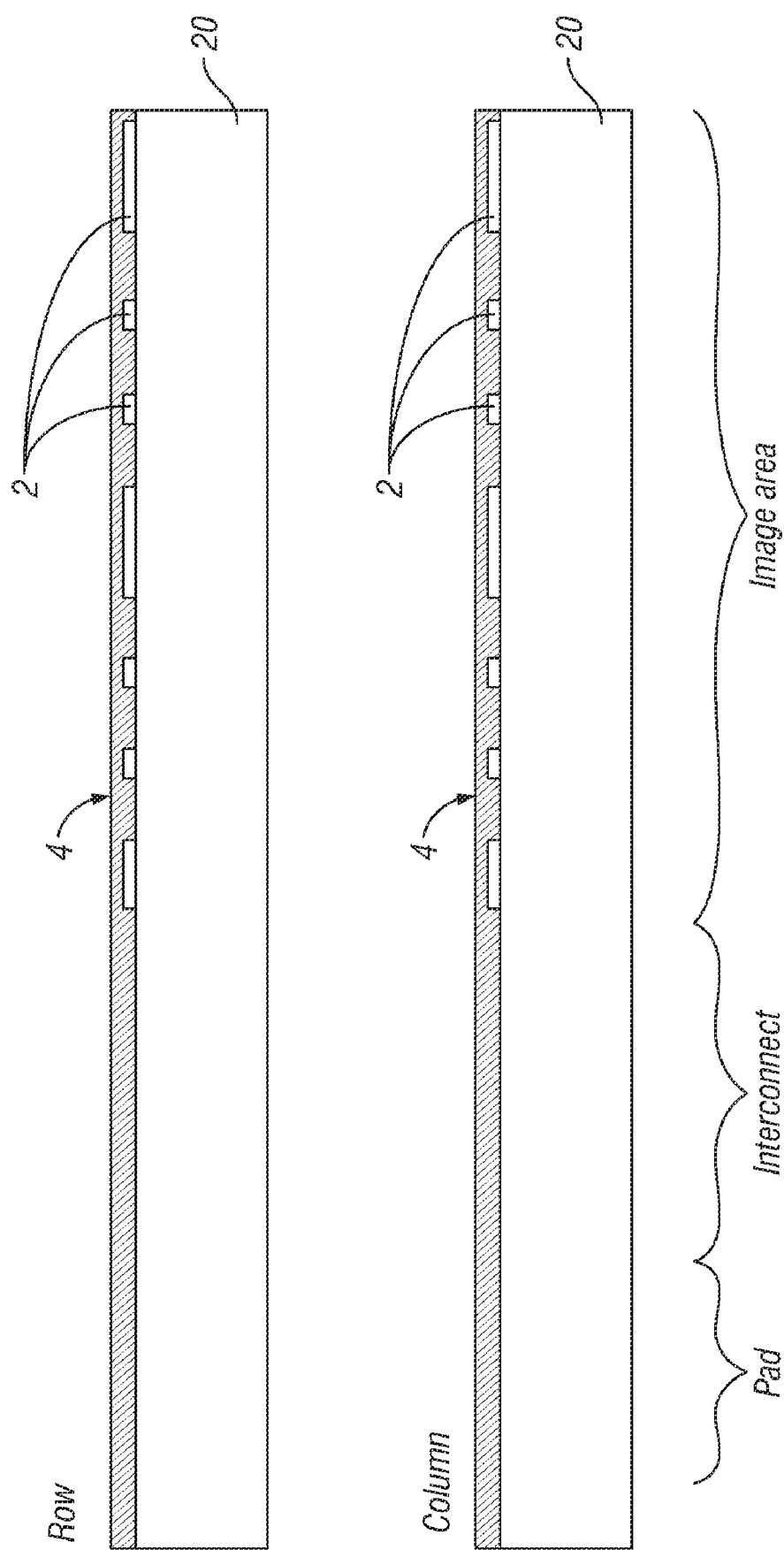
FIGS. 11A-11K are cross sections showing a process for making another embodiment of an interferometric modulator.

FIGS. 11A-11K describe an other exemplary process for manufacturing a device that utilizes a single deposited layer of conductive material to form a cavity and an interconnect structure. Each figure illustrates a cross-sectional view (top cross-sectional view) of the device along the length of a row electrode and another cross-sectional view (bottom cross-sectional view) along the length of a column electrode. According to this embodiment, the insulating layer of the optical stack 16 is not patterned and etched before deposition of the conductive material 60. As shown in FIG. 11A, a dark matrix 2 formation is preferably performed by depositing, masking, and etching a layer of dark mask (e.g., MoCr) to minimize reflections from unswitched parts of pixels over the transparent substrate 20. The dark matrix deposition comprises depositing a dielectric material 4, such as silicon dioxide ($SiO_2$), over the structure before an ITO layer (of the optical stack 16) is deposited.

Figure 11B:
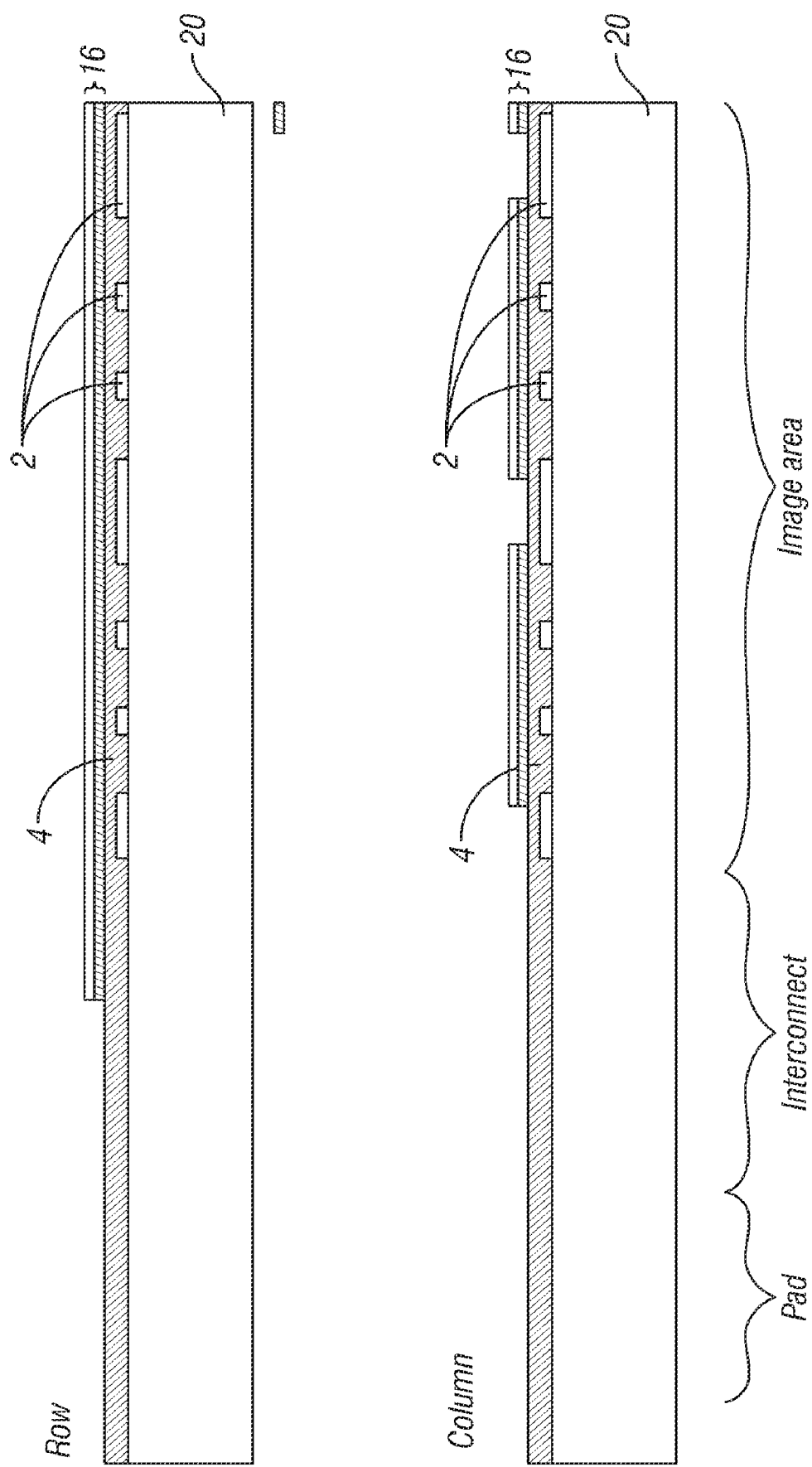
Figure 11C:
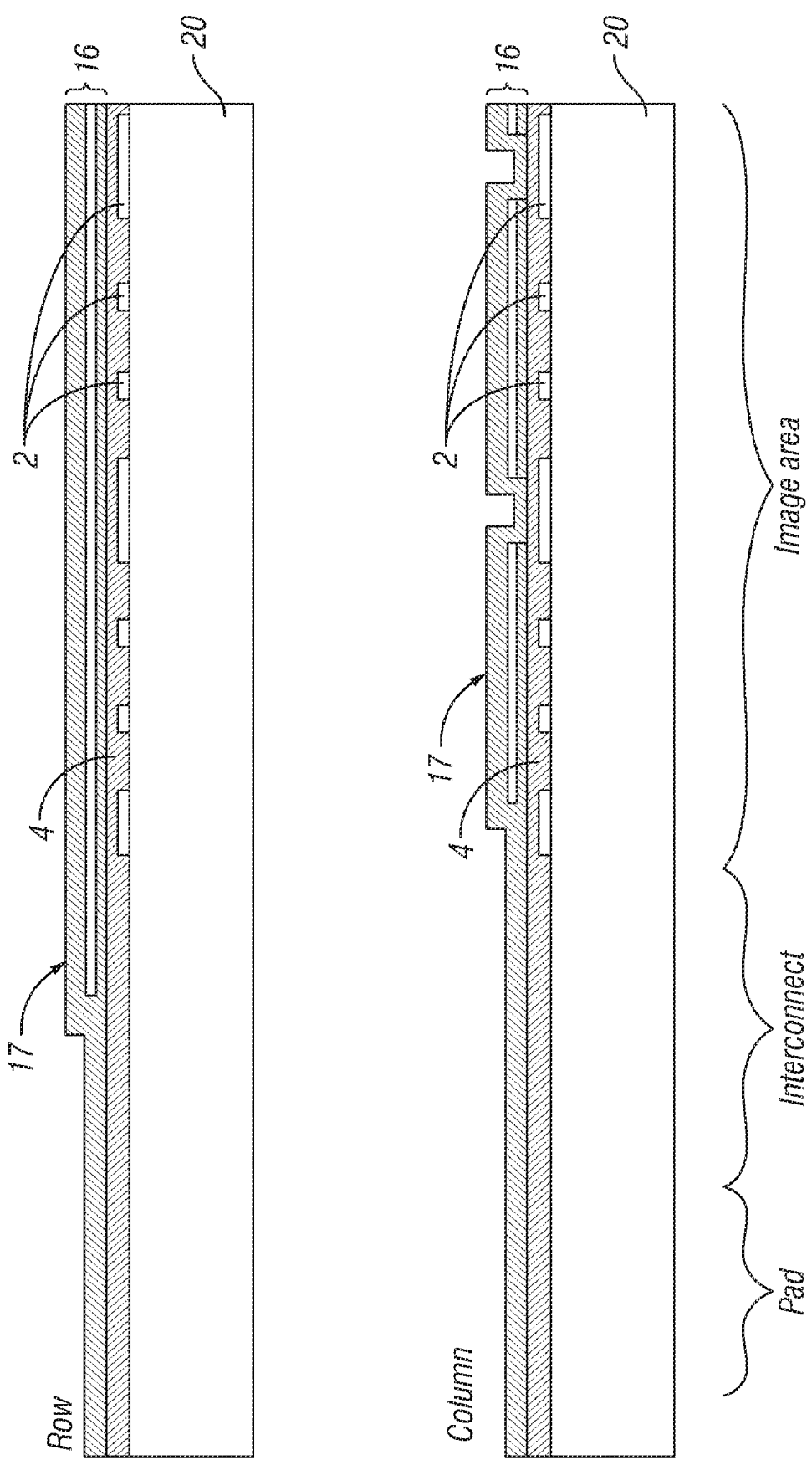

A relatively thin layer of MoCr or Cr is preferably deposited over the ITO. The ITO and MoCr or Cr are then etched and patterned into rows to form the electrodes of the optical stack 16, as shown in FIG. 11B. A dielectric layer 17, preferably formed of silicon dioxide ($SiO_2$), is preferably formed over the structure, as shown in FIG. 11C. Alternatively, silicon dioxide may be covered with an aluminum oxide ($Al_2O_3$) cap or similar stop layer that protects the silicon dioxide from the subsequent release etch. According to this embodiment, the dielectric layer 17 is not patterned before a sacrificial layer 60 is deposited, eliminating one masking step and one etch step from the process flow.

Figure 11D:
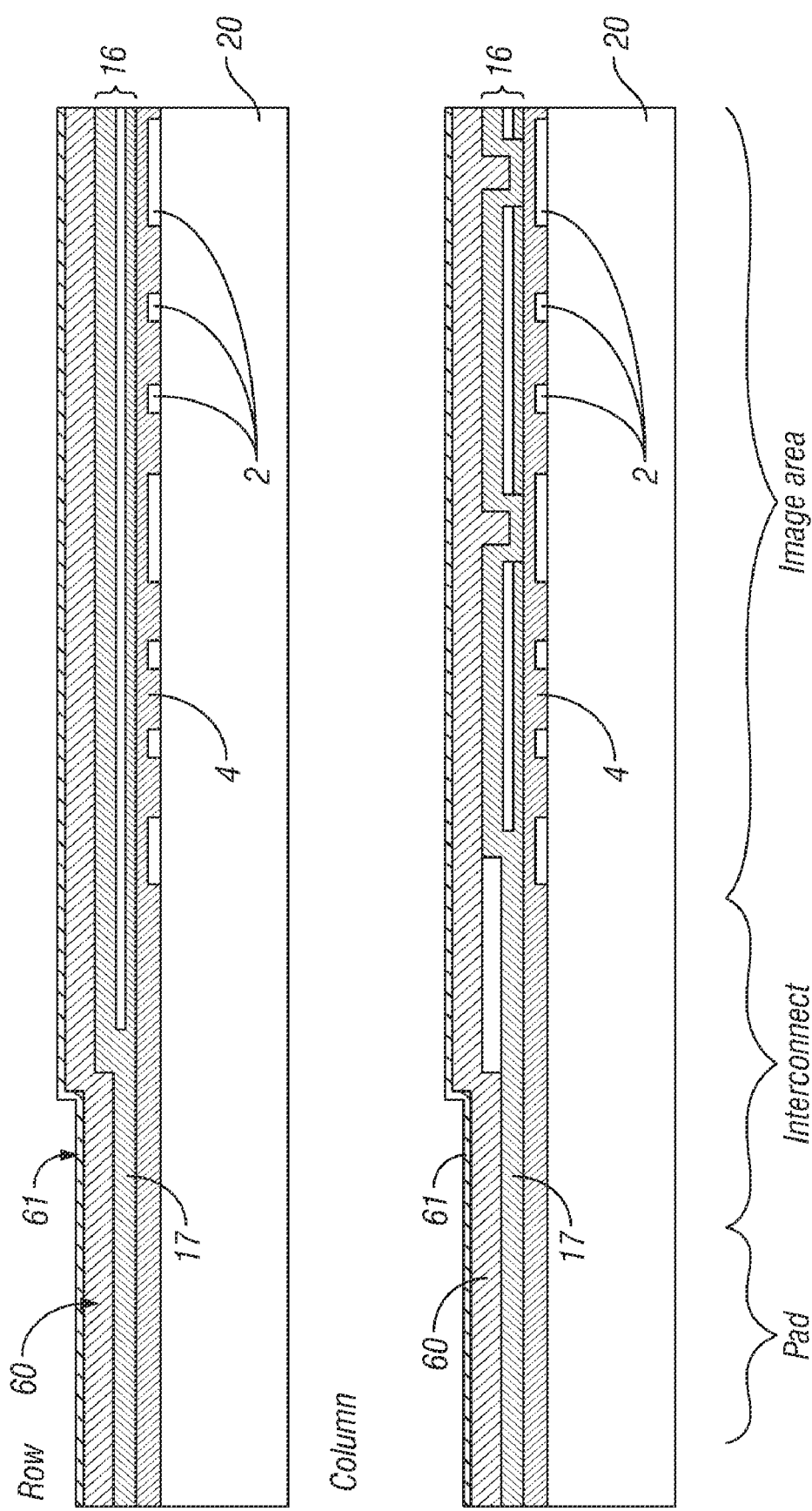

As shown in FIG. 11D, a layer of conductive material 60, preferably of molybdenum (Mo), is preferably deposited (and later removed from some locations) over the structure to create the interconnect structures as well as to create the resonant optical cavities 19 (see FIGS. 11J and 11K) between the electrodes of the optical stack 16 and the movable layer 14 (which will be deposited, as described below). Also as shown in FIG. 11D, a layer of reflective material 61 (e.g., aluminum) is deposited over the conductive layer 60.

Figure 11E:
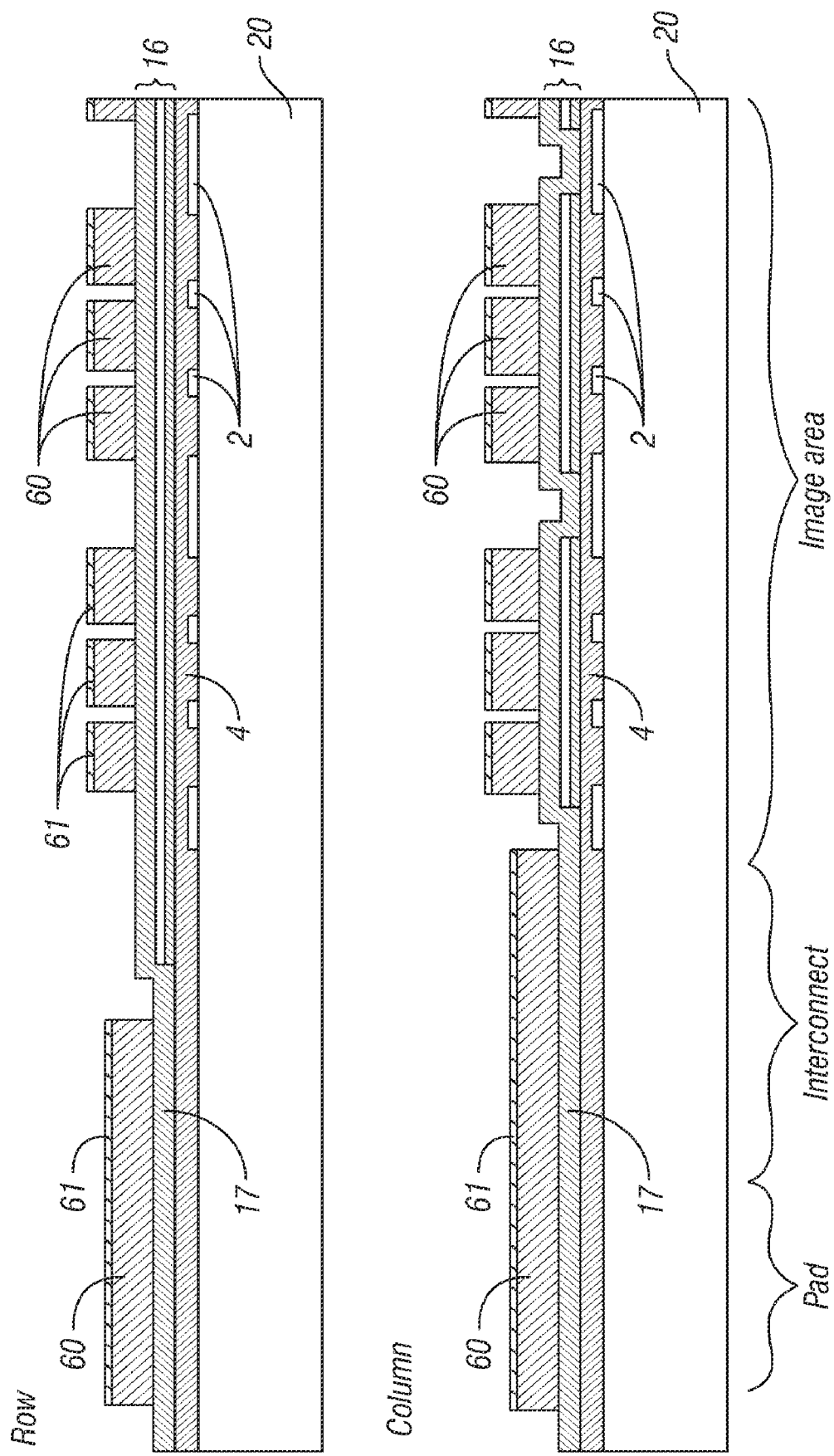

The conductive layer 60 and reflective layer 61 are preferably patterned and etched over the electrodes 16, as shown in FIG. 11E. The conductive layer 60 and reflective layer 61 are patterned and etched together in order to form vias for support structures (the deposition of which will be described below) in the image or display area of the device. The conductive material 60 is preferably left in the peripheral areas in a pattern to form the interconnect and routing, as shown in FIG. 11E. It will be understood that, although the edges of the conductive layer 60 and the reflective layer 61 are illustrated as aligned, they need not be aligned. The skilled artisan will also understand that other conductive layers may be added to the stacks of the conductive layer 60 and the reflective layer 61 in the interconnect region, and that various combinations of such conductive layers could be used.

In the illustrated embodiment, both the conductive material 60 and the reflective layer 61 are patterned and etched at the same time. However, in this embodiment, because the dielectric layer 17 is not patterned and etched prior to deposition of the sacrificial material, there is no direct connection between the conductive layer 60 and the ITO of the optical stack 16.

Figure 11F:
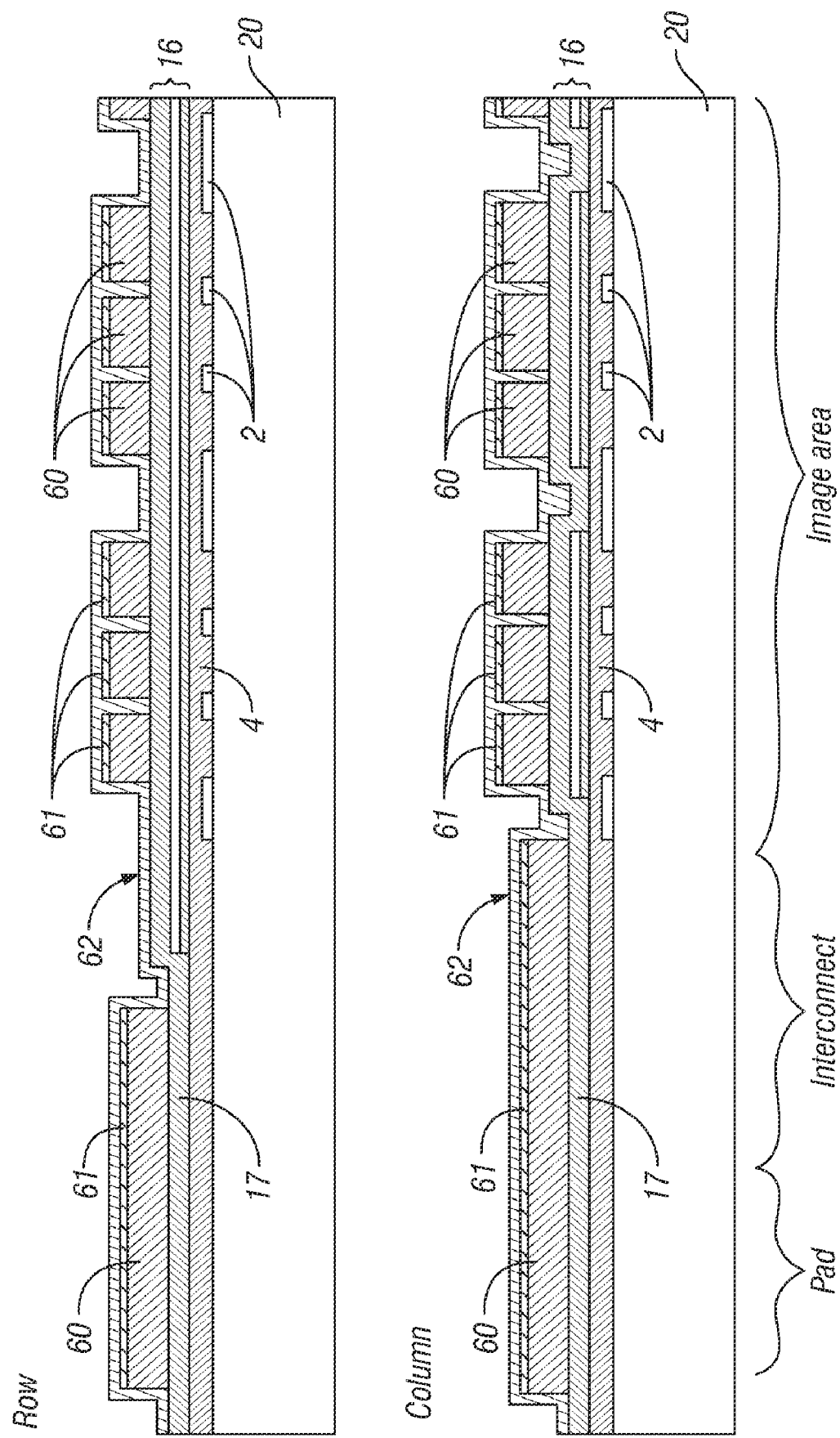
Figure 11G:
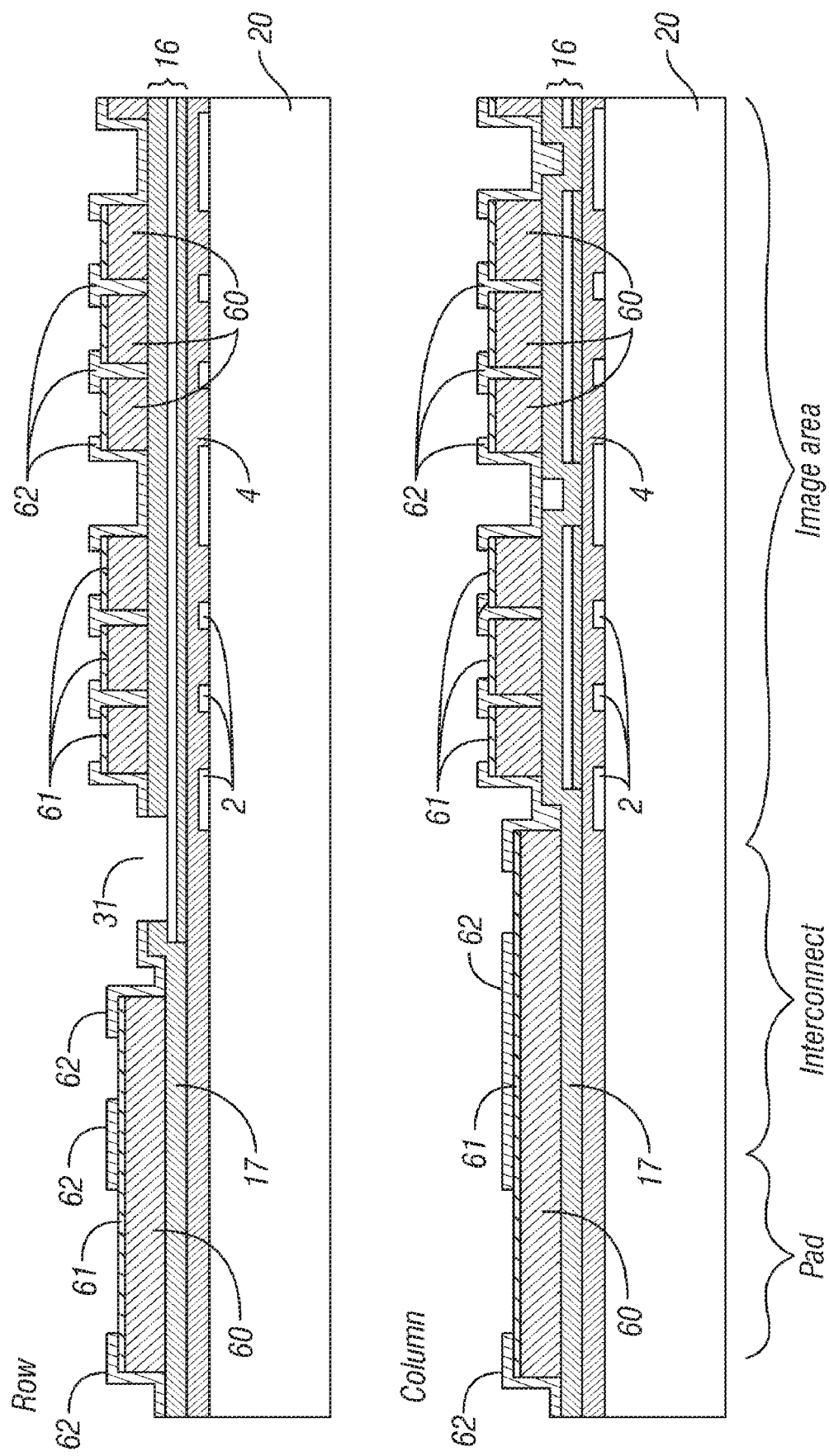

After patterning and etching the conductive layer 60 and reflective layer 61, a dielectric layer 62, preferably formed of silicon dioxide ($SiO_2$) or silicon nitride, is deposited over the entire structure, as shown in FIG. 11F. The dielectric layer 62 is then patterned and etched to form support structures or posts and also to create contact cuts 31, as shown in FIG. 11G. The skilled artisan will appreciate that some of the $SiO_2$ dielectric 62 covers the Mo conductive material 60 and reflective layer 61 in the routing/interconnect areas. The combination of the dielectric 62 and the top surface reflecting layer 61 serves to protect the Mo interconnect material during the subsequent release etch, which will be described in more detail below.

Figure 11H:
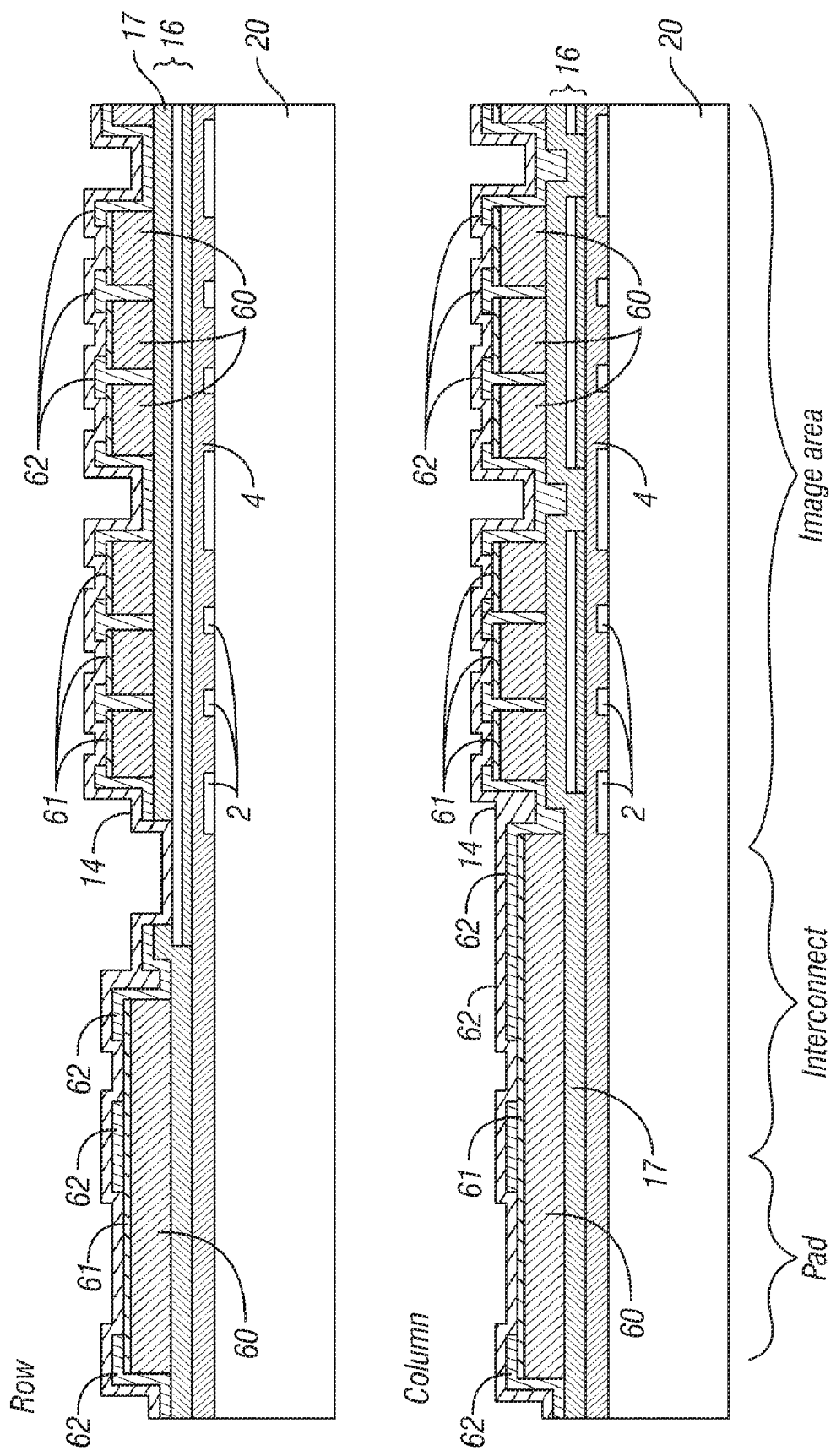
Figure 11I:
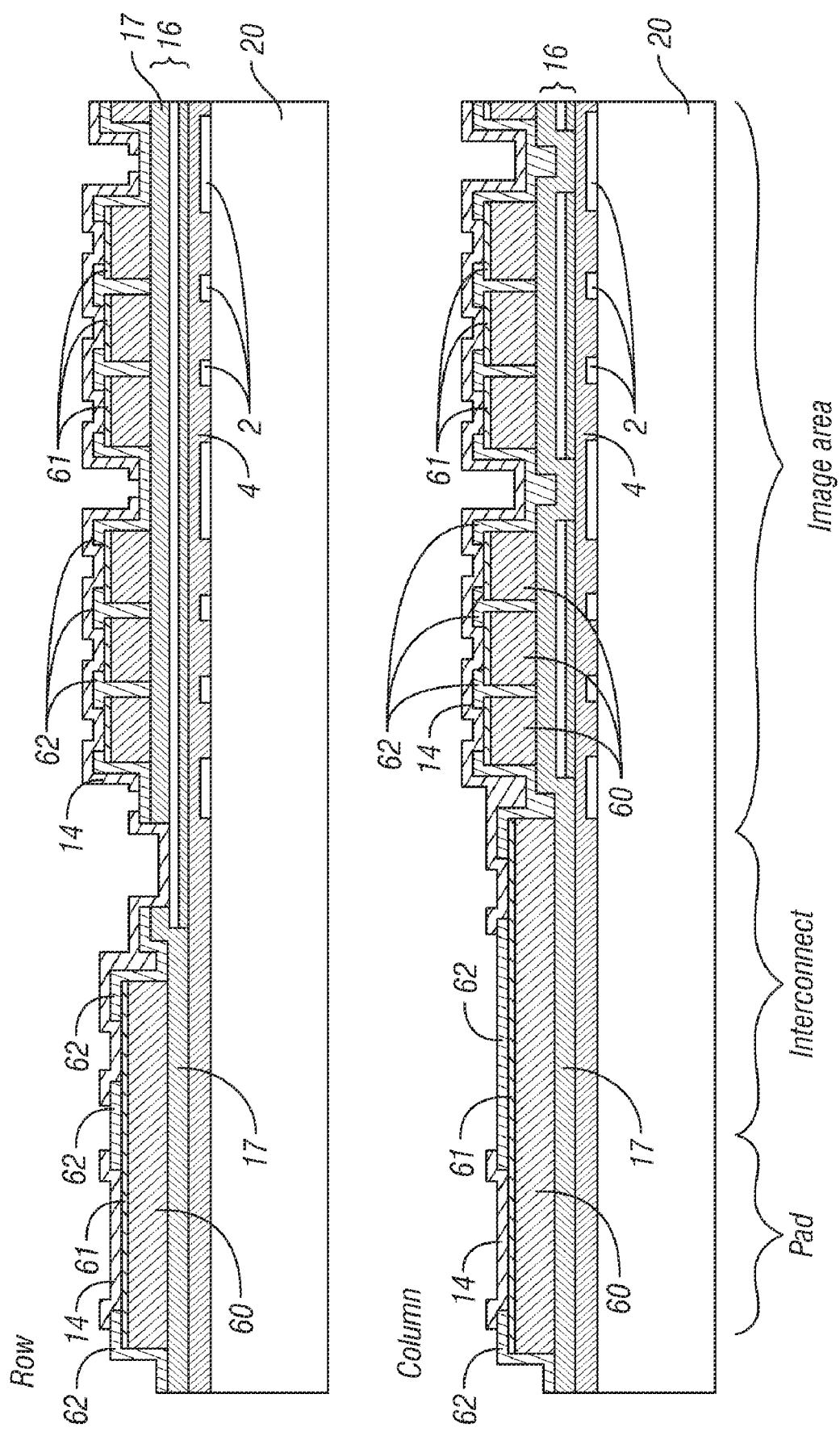

As shown in FIG. 11H, the movable or mechanical layer 14 is deposited over the entire structure. According to this embodiment, the movable layer 14 is preferably formed of nickel. This movable layer 14 is deposited and patterned into columns orthogonal to the electrodes of the optical stack 16 to create the row/column array described above. The movable layer 14 is patterned and etched, as shown in FIG. 11I. As shown in the top of FIG. 11J, part of the movable layer 14 serves to strap the row electrodes of the optical stack 16 to the interconnect formed by the conductive material 60.

Figure 11J:
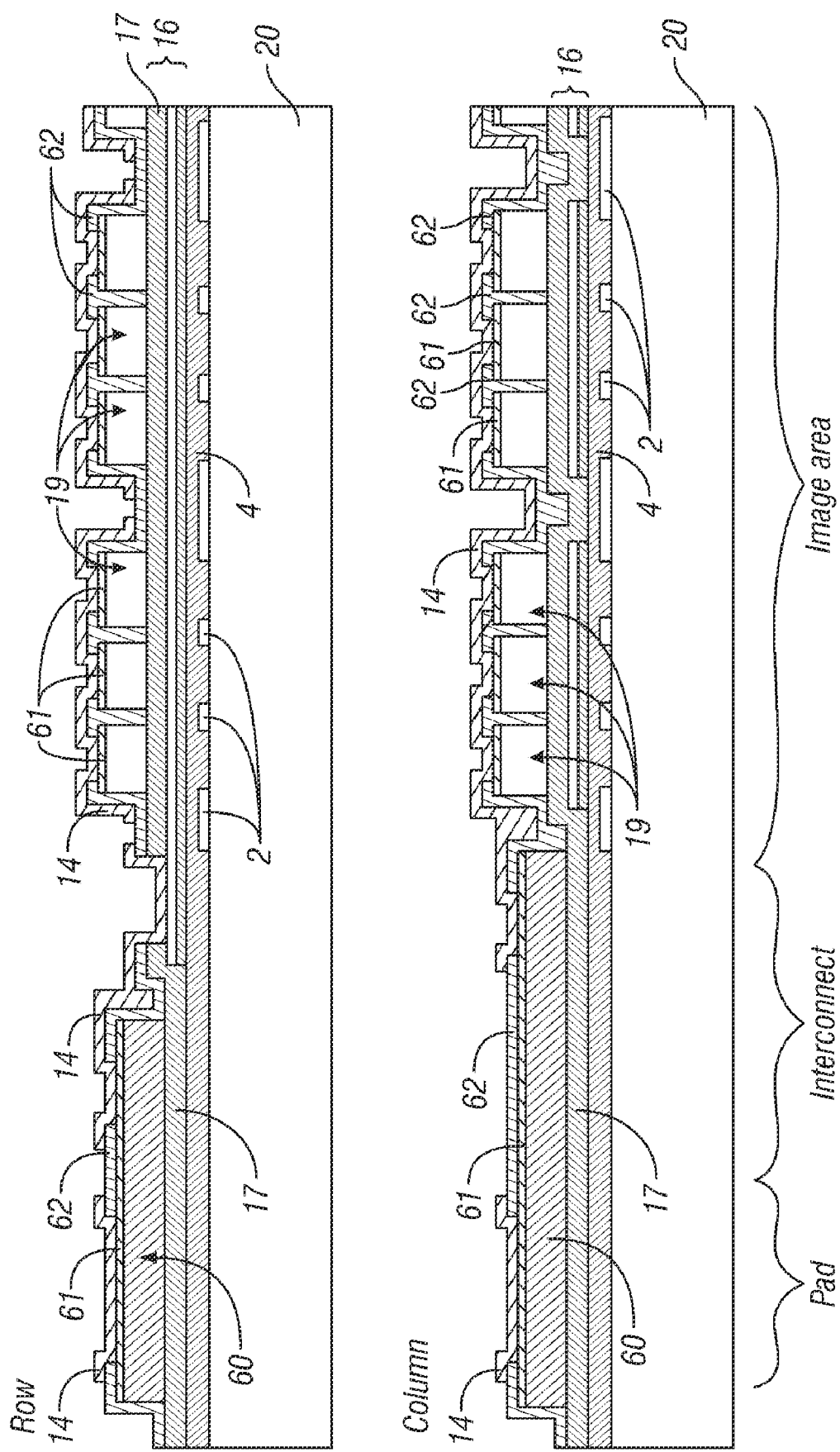

The sacrificial layer comprising the conductive material 60 is removed in a release etch, preferably after the movable layer 14 is formed, to create the optical cavity 19 between the fixed electrodes of the optical stack 16 and the movable layer 14 in the display area, as shown in FIG. 11J. As discussed above, standard release techniques may be used to remove the sacrificial layer 60 in the image area.

When the release etch is performed, the conductive material 60 forming the sacrificial layer is removed to form cavities 19 in the pixels (in the image or display area) but the aluminum of the preferred reflective layer 61 remains. In the routing/interconnect area, the aluminum reflective layer 61 also remains over the conductive material 60, which is protected from the release etch to form the routing/interconnect. As shown in FIG. 11J, the conductive material 60 in the routing/interconnect area is encapsulated by portions of the support structure material 62 and the aluminum reflective layer 61. The skilled artisan will appreciate that the aluminum of the reflective layer 61 also provides a higher conductivity strap on the molybdenum lines in the routing/interconnect region, thereby lowering interconnect resistance. In this embodiment, electrical connection to the electrodes of the optical stack 16 is provided by the movable metal layer 14, formed preferably of nickel. In this embodiment, the top surface of the molybdenum interconnect material 60 is protected by both the aluminum layer and the dielectric support structure material. The sidewalls of the molybdenum interconnect are protected by the dielectric support structure material only.

According to this embodiment, the skilled artisan will appreciate that the molybdenum peripheral routing/interconnect 60 is preferably encapsulated and protected from the release etch for forming the optical cavity 19, as described above. To protect the molybdenum peripheral routing 60 from the release etch, an inorganic material (e.g., silicon dioxide or silicon nitride) is preferably used for support structures 62 such that the molybdenum peripheral routing 60 is protected from the release etch. As shown in FIG. 11I, the molybdenum peripheral routing 60 is encapsulated by portions of the inorganic support structure material 62 and the movable layer 14 such that it is protected from the release etch. The skilled artisan will appreciate that the inorganic support structure material 62 and the movable layer 14 will not be removed by the release etch. As shown in FIG. 11J, the molybdenum 60 remains in areas where it is encapsulated to form the peripheral routing/interconnect and is etched to form the optical cavity 19 where it is exposed in the display area. The skilled artisan will appreciate that, in this embodiment as compared with the first embodiment described, the step of masking and patterning of the dielectric layer 17 (as shown in FIG. 8D) is eliminated.

Figure 11K:
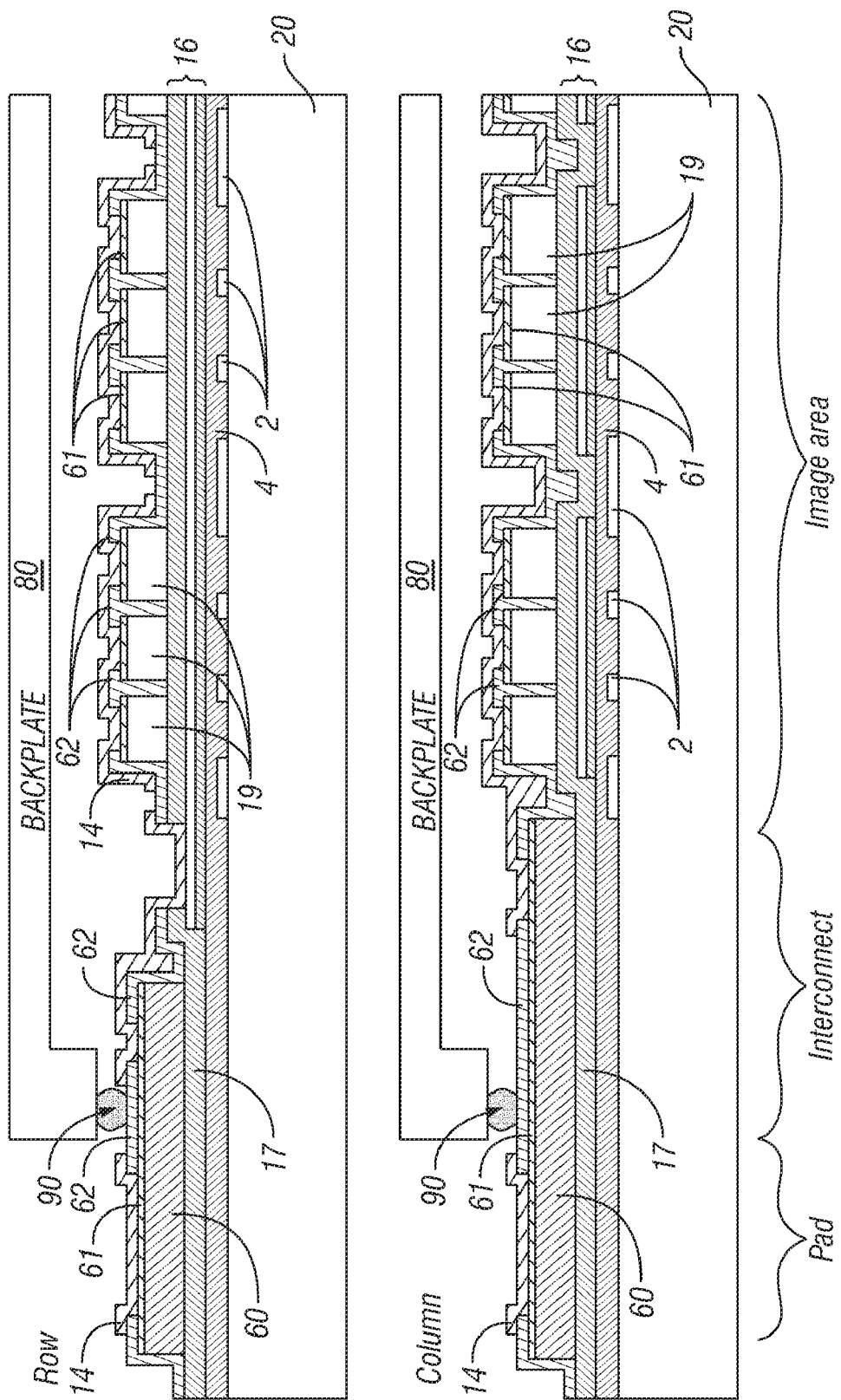

After the release etch, a backplate 80 is preferably sealed to the transparent substrate 20 using a seal 90, which is preferably hermetic, to further protect the image or display area of the interferometric modulator. As shown in FIG. 11K, the seal 90 is in the area of the molybdenum peripheral routing/interconnect 60. The backplate 80 and seal 90 protect the interferometric modulator from harmful elements in the environment.

Figure 7D:
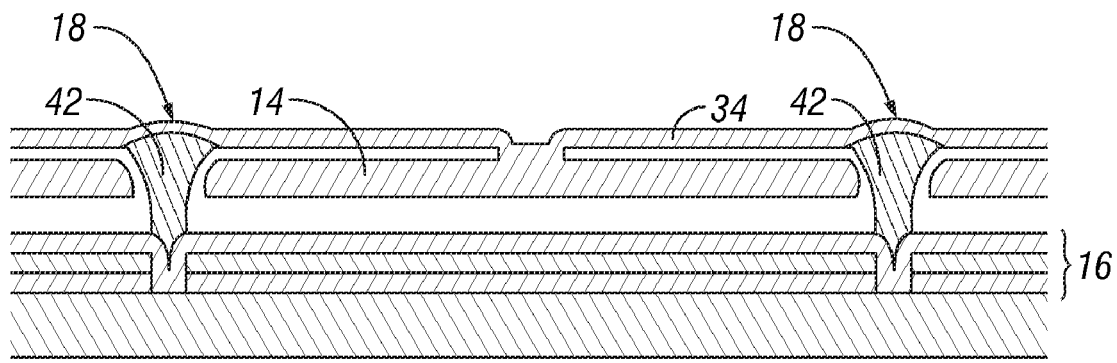
FIG. 7D is a cross section of yet another alternative embodiment of an interferometric modulator.
Figure 7E:
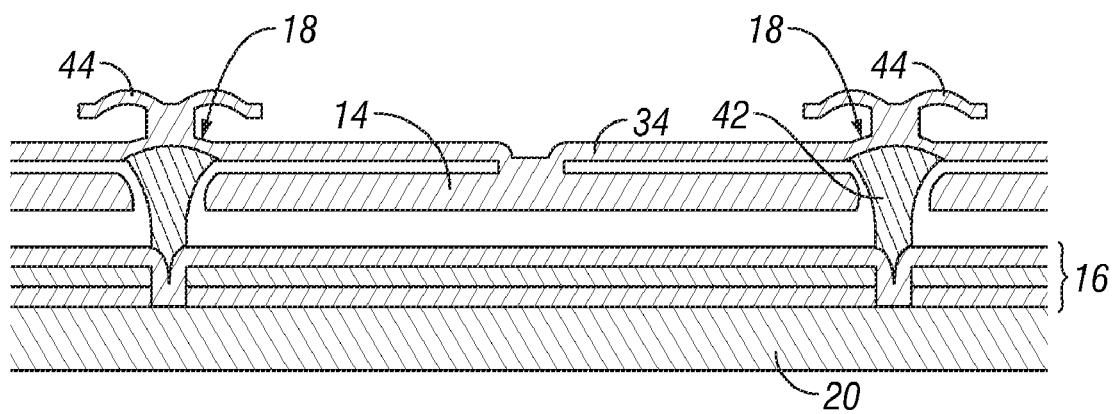
FIG. 7E is a cross section of an additional alternative embodiment of an interferometric modulator.

As discussed above, certain embodiments of MEMS devices, and in particular interferometric modulators, comprise a movable layer comprising a reflective layer that is partially detached from a mechanical or deformable layer (e.g., FIGS. 7C-7E). Another exemplary process will be described with reference to FIGS. 12A-12I. It will be understood that FIGS. 12A-12I are cross-sectional views of the row electrodes of the device. According to this embodiment, the peripheral routing/interconnect is formed from the same material that is used to form a conductive layer, such as, for example, the reflective layer (e.g., aluminum mirror) in the movable layer, within the MEMS device.

As shown in FIG. 12A, a reflective layer 90 is deposited in the peripheral interconnect region and over a patterned sacrificial layer 82 in the image area. As illustrated in FIG. 12A, according to this embodiment, the sacrificial layer 82 is patterned such that is remains only in the image (or "array" or "display") area. It will be understood that the sacrificial material 82 is preferably deposited (and later selectively removed) over the optical stack 16 to define a resonant optical cavity 19 (FIG. 12I) between the optical stack 16 and a movable layer that will be deposited, as described in more detail below. It will be understood that the sacrificial layer 82 may comprise multiple layers that are deposited and subsequently patterned to form a sacrificial layer 82 having multiple thicknesses to produce multiple different colors, such as red, green, and blue for an RGB display system. As shown in FIG. 12A, the sacrificial layer 82 has varying thicknesses. The skilled artisan will understand that these varying thicknesses correspond to varying heights of the cavity 19 (FIG. 12I) that is formed when the sacrificial layer 82 is removed, as will be described below. In the process of forming the three different heights, the thinnest of the three illustrated portions of the sacrificial layer can be formed from a single deposited layer; the intermediate thickness formed from two depositions; and the thickest portion formed from three depositions. Etch stop layers can optionally intervene between the depositions. In an exemplary embodiment, a modulator having a cavity with the largest height (formed by a sacrificial layer having the greatest thickness) reflects red light, a modulator having a cavity with an intermediate height (formed by a sacrificial layer having an intermediate thickness) reflects green light, and a modulator having a cavity with the smallest height (formed by a sacrificial layer having the smallest thickness) reflects blue light.

Note that the sacrificial layer 82 may have undulations, as shown, as a result of undulations (not shown) in underlying structures, such as the optical stack 16. The optical stack 16 is shown only schematically in the figures.

The reflective layer 90 is preferably formed of a conductive material, such as aluminum or an aluminum alloy. According to certain embodiments, the reflective layer 90 comprises a single layer of reflective material. In other embodiments, the reflective layer 90 may comprise a thin layer of reflective material with a layer of more rigid material (not shown) overlying the thin layer of reflective material. As the reflective layer of this embodiment will be partially detached from an overlying mechanical layer (FIGS. 12I) in the image area, the reflective layer 90 preferably has sufficient rigidity to remain in a substantially flat position relative to the optical stack 16 even when partially detached, and the inclusion of a stiffening layer on the side of the reflective layer located away from the optical stack can be used to provide the desired rigidity.

In FIG. 12B, the reflective layer 90 of FIG. 12A is patterned to form a patterned mirror layer 200 in the image area. At the same time, the reflective layer 90 is patterned in the peripheral interconnect area to form the interconnect or routing 202 in the periphery of the display, where the interconnect is between circuitry outside the array and an electrode within the array.

As illustrated in FIG. 12C, a second sacrificial layer 196 is deposited over the entire structure, over both the patterned mirror layer 200 in the image area as well as over the interconnect 202. Preferably, the second sacrificial layer 196 is formed from the same material as the first sacrificial layer 82, or, alternatively, is etchable selectively with respect to the surrounding materials by the same etchant as the first sacrificial layer 82. While referred to herein as a "second" sacrificial layer 196, it will be understood that it may in fact represent the fourth deposition of sacrificial material, due to the use of three depositions to define the three cavity heights.

In FIG. 12D, the second sacrificial layer 196 is patterned. In the interconnect region, the second sacrificial layer 196 remains over portions of the interconnect 202. As illustrated in FIG. 12D, tapered apertures 86 are formed and extend through both the second sacrificial layer 196 and the first sacrificial layer 82, thereby patterning the sacrificial layers 196, 82.

Figure 12E:
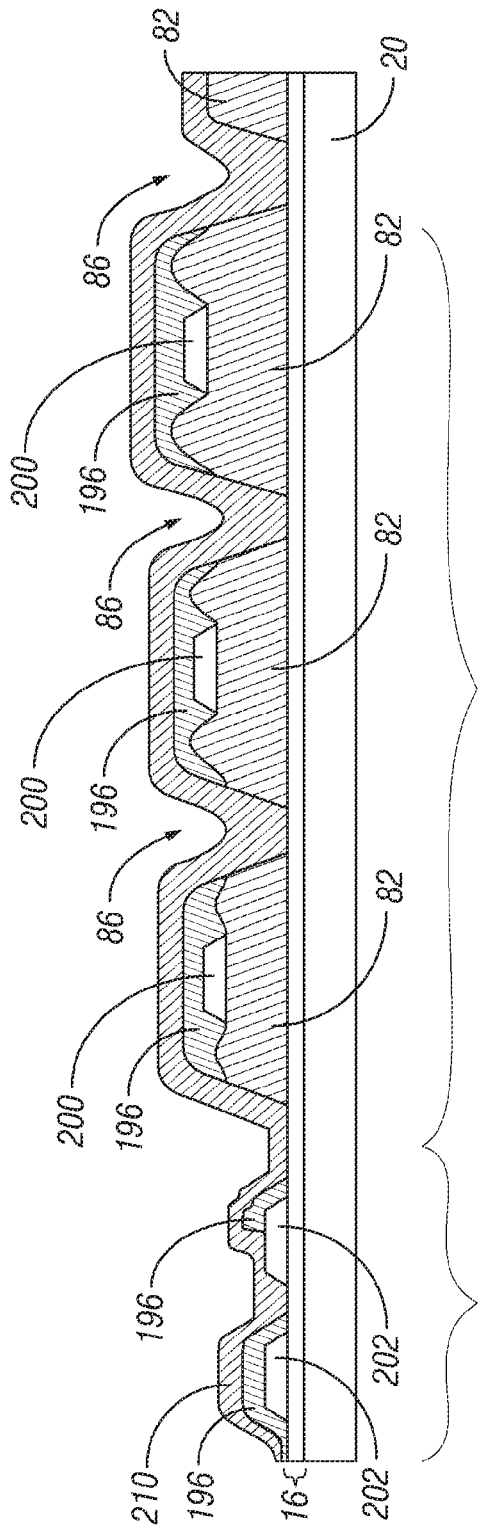
FIGS. 12A-12I are cross sections showing a process for making yet another embodiment of an interferometric modulator.
Figure 12F:
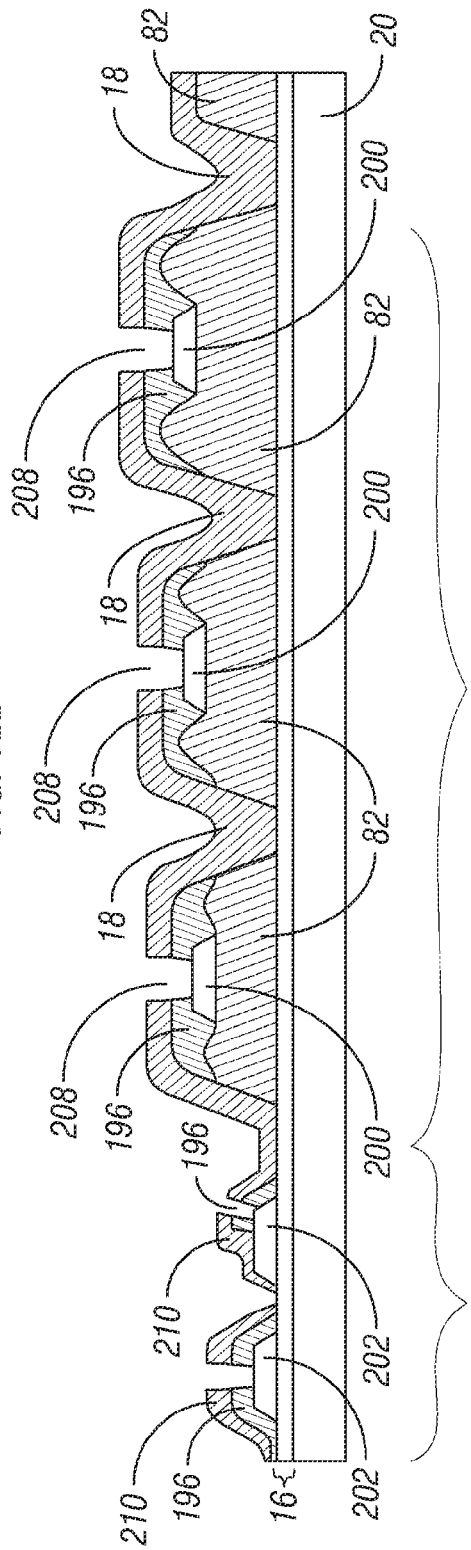

As shown in FIG. 12E, a post oxide material 210 is deposited over the entire structure. It will be understood that the post oxide material preferably comprises an inorganic material (e.g., $SiO_2$). As illustrated in FIG. 12F, this post oxide material 210 is then patterned to form supports 18 for the device in the image or display area. It can also be seen in FIG. 12F that apertures 208 are formed in portions of the second sacrificial layer 196 overlying the patterned mirror layer 200, exposing at least a portion of the patterned mirror layer 200. In the interconnect region, the post oxide material 210 is patterned to expose portions of the interconnect 202 to form contacts, as will be described below. The skilled artisan will appreciate that the post oxide material 210 can also be patterned to passivate the interconnect/routing 202.

Figure 12G:
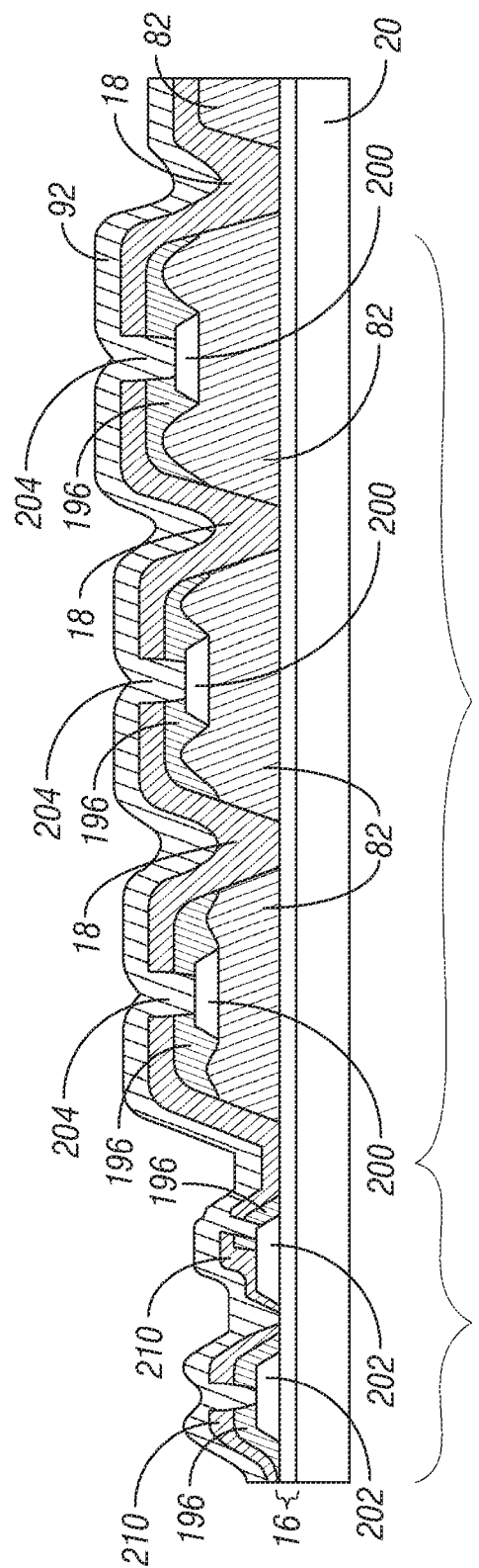
Figure 12H:
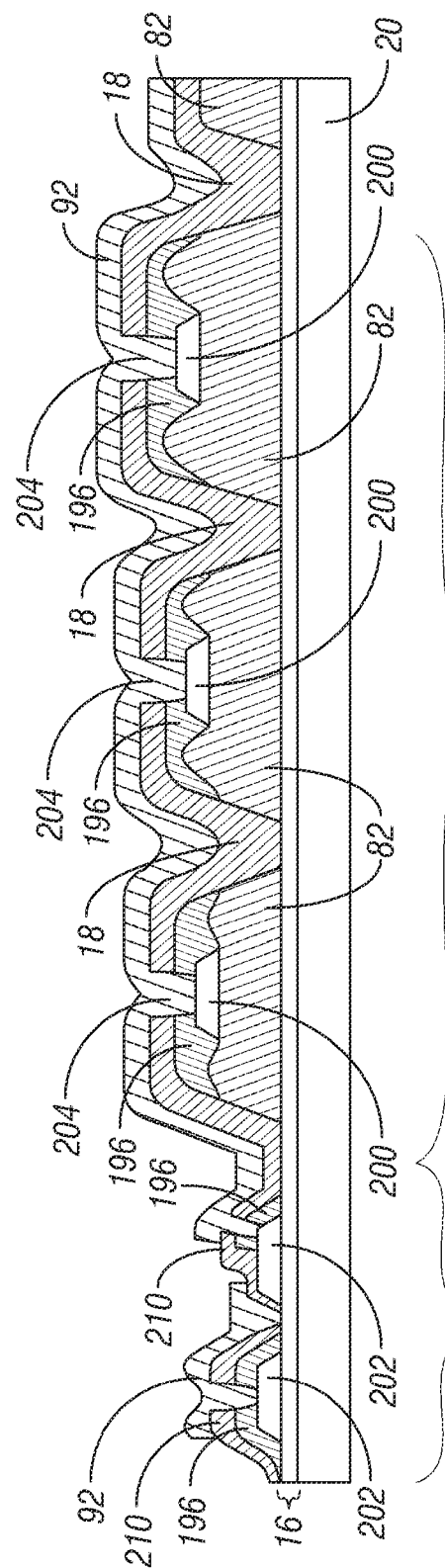
Figure 12L:
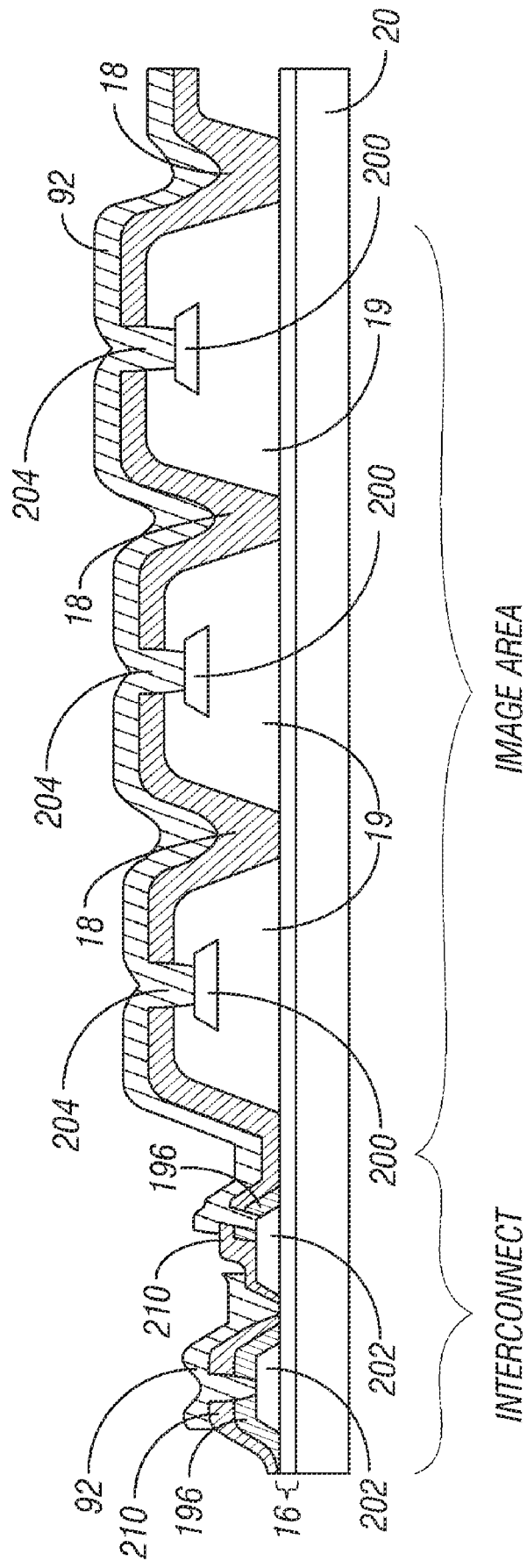

As shown in FIG. 12G, a mechanical layer 92 is deposited over the patterned post oxide material 210 and exposed portions of the patterned mirror layer 200. According to a preferred embodiment, the mechanical layer 92 is formed of nickel. In particular, it can be seen that the mechanical layer 92 at least partially fills the aperture 208 (FIG. 12F) such that a connector portion 204 connecting the mechanical layer 92 and the patterned mirror layer 200 is formed. As illustrated in FIG. 12G, the mechanical layer 92 contacts the interconnects 202 in the interconnect region in the exposed areas where the post oxide material 210 is removed (FIG. 12F). As shown in FIG. 12H, the mechanical layer 92 is then patterned to form the column electrodes described above. The skilled artisan will appreciate that small holes (not shown) are preferably etched in the mechanical layer 92 to allow the sacrificial layers 82, 196 to be removed by a release etch, using a release etchant, as described below.

In FIG. 12I, a release etch is performed to remove both the first sacrificial layer 82 and the second sacrificial layer 196, thereby forming an optical gap or cavity 19 between the patterned mirror layer 200 and the optical stack 16. Thus, an optical MEMS device is formed, which includes a movable layer comprising a mechanical layer 92 from which a patterned mirror layer 200 is suspended, where the patterned mirror layer 200 is partially detached from the mechanical layer 92. It can be seen in FIG. 12I that the post oxide material 210 protects the interconnect/routing 202 from the release etch. It will be understood that, in the illustrated example, the thickness of the molybdenum layer 60 of the interconnect/routing 202 has some correspondence to the thickness of the patterned mirror layer 200, as the interconnect/routing 202 and the patterned mirror layer 200 are formed from a single deposited reflective layer 90. This MEMS device also includes an electrical interconnect/routing 202, which electrically connects circuitry outside the array with the electrodes within the array, that is formed by patterning the reflective layer 20. It will be understood that, in this embodiment, the same material used to form the patterned mirror layer 200 is used to form the electrical interconnect/routing 202. This optical MEMS device may be, for example, an interferometric modulator such as that described with respect to FIG. 7C and elsewhere throughout the application. The skilled artisan will understand that in non-optical MEMS devices, the suspended upper electrode need not be reflective.

It will be understood that, in the embodiments described herein, a conductive material is deposited between the electrode of the optical stack and the mechanical layer of upper electrode formation and the same layer of conductive material is also used for an electrical interconnect or routing. In one embodiment, the electrical interconnect/routing is formed of the same material as the movable layer or reflective mirror. In another embodiment, the electrical interconnect/routing is formed of the same material as one of the sacrificial layers used to create an optical cavity within the device. Note that the embodiment of FIGS. 12A-12I illustrates four possible sacrificial layer depositions that could be used for interconnect definition or strapping in place of the mirror deposition.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A microelectromechanical systems device, comprising:
    a fixed electrode;
    a reflective layer in a display region of the device;
    a mechanical layer over the reflective layer;
    a conductive layer between the fixed electrode and the reflective layer; and
    an electrical interconnect in a peripheral region of the device, the electrical interconnect in electrical communication with circuitry outside the device and at least one of the fixed electrode and the reflective layer, wherein at least a portion of the electrical interconnect and the conductive layer are formed from a same material, wherein a thickness of the portion of the electrical interconnect corresponds to a thickness of the conductive layer.

2. The microelectromechanical systems device of claim 1, wherein the conductive layer is a sacrificial layer etchable in the display region to create a cavity between the reflective layer and the fixed electrode.

3. The microelectromechanical systems device of claim 2, wherein the same material is selected from the group consisting of molybdenum, doped silicon, tungsten, and titanium.

4. The microelectromechanical systems device of claim 1, wherein the device is an interferometric modulator.

5. The microelectromechanical systems device of claim 1, wherein the reflective layer is suspended from the mechanical layer.

6. The microelectromechanical systems device of claim 1, further comprising:
    a display;
    a processor that is in electrical communication with said display, said processor being configured to process image data;
    a memory device in electrical communication with said processor.

7. The microelectromechanical systems device of claim 6, further comprising:
    a driver circuit configured to send at least one signal to said display.

8. The microelectromechanical systems device of claim 7, further comprising:
    a controller configured to send at least a portion of said image data to said driver circuit.

9. The microelectromechanical systems device of claim 7, further comprising:

an image source module configured to send said image data to said processor.

10. The microelectromechanical systems device of claim 9, wherein said image source module comprises at least one of a receiver, transceiver, and transmitter.

11. The microelectromechanical systems device of claim 6, further comprising:
an input device configured to receive input data and to communicate said input data to said processor.

12. A method of forming a microelectromechanical systems device, the method comprising:
providing a fixed electrode;
forming a conductive layer over the fixed electrode;
patterning the conductive layer to form at least a portion of an electrical interconnect in a peripheral region of the device and to form at least a portion of a sacrificial layer in a display region of the device, wherein a thickness of the electrical interconnect corresponds to a thickness of the sacrificial layer, the electrical interconnect in electrical communication with circuitry outside the device and at least one of the fixed electrode and a second electrode over the sacrificial layer; and
forming a mechanical layer over the conductive layer after patterning the conductive layer.

13. The method of claim 12, further comprising removing the sacrificial layer, wherein, after removing the sacrificial layer, the second electrode is movable.

14. The method of claim 12, wherein the electrical interconnect comprises aluminum.

15. The method of claim 12, wherein the conductive layer comprises a material selected from the group consisting of molybdenum, doped silicon, tungsten, and titanium.

16. The method of claim 15, further comprising creating a cavity between the fixed electrode and the mechanical layer in the display region after patterning the conductive layer.

17. The method of claim 16, wherein creating the cavity comprises selectively removing the conductive layer.

18. The method of claim 17, wherein selectively removing the conductive layer comprises etching with xenon difluoride.

19. The method of claim 16, further comprising, after patterning the conductive layer, encapsulating the conductive material in the peripheral region to protect the portion of the electrical interconnect from being etched during creating the cavity.

20. The method of claim 12, wherein the device is an interferometric modulator.

21. A method of forming a microelectromechanical systems device, the method comprising
providing a fixed electrode formed over a substrate;
forming a movable layer over the fixed electrode in a display region of the device;
forming a mechanical layer over the movable layer;
depositing a conductive layer between the fixed electrode and the mechanical layer, wherein a portion of the conductive layer forms at least a part of an electrical interconnect in a peripheral region of the device, the electrical interconnect in electrical communication with circuitry outside the device and at least one of the fixed electrode and the movable layer; and
selectively removing the conductive layer to create at least one cavity in the display region, wherein a thickness of the part of the electrical interconnect corresponds to a height of the cavity.

22. The method of claim 21, wherein the device is an interferometric modulator.

23. The method of claim 21, wherein forming the movable layer comprises forming a portion of the electrical interconnect, wherein the movable layer comprises aluminum.

24. The method of claim 21, wherein the conductive layer comprises a material selected from the group consisting of molybdenum, doped silicon, tungsten, and titanium.

25. The method of claim 21, wherein forming the electrical interconnect comprises:
depositing a layer comprising silicon; and
selectively doping the silicon.

26. A microelectromechanical systems device, comprising:
a fixed electrode;
a movable layer in a display region of the device;
a mechanical layer over the movable layer;
a cavity between the fixed electrode and the movable layer; and
an electrical interconnect in a peripheral region of the device, the electrical interconnect in electrical communication with circuitry outside the device and at least one of the fixed electrode and the movable layer, wherein a thickness of a portion of the electrical interconnect corresponds to a height of the cavity.

27. The microelectromechanical systems device of claim 26, wherein the device is an interferometric modulator.

28. The microelectromechanical systems device of claim 26, wherein the movable layer is suspended from the mechanical layer.

29. A method of forming a microelectromechanical systems device, the method comprising:
providing fixed electrode;
depositing a conductive material over the fixed electrode;
forming a movable layer over the conductive layer;
depositing a mechanical layer over the movable layer, wherein the conductive material forms at least a portion of an electrical interconnect in a peripheral region of the device, the electrical interconnect in electrical communication with circuitry outside the device and at least one of the fixed electrode and the movable layer; and
selectively removing the conductive material in a display region of the device to form a cavity between the fixed electrode and the movable layer after the mechanical layer is deposited.

30. The method of claim 29, wherein the device is an interferometric modulator.

31. The method of claim 29, wherein the conductive material is selected from the group consisting of molybdenum, doped silicon, tungsten, and titanium.

32. The method of claim 29, wherein selectively removing the conductive material comprises etching with xenon difluoride.

33. The microelectromechanical systems device of claim 1, wherein the thickness of the portion of the electrical interconnect is the same as the thickness of the conductive layer.

34. The microelectromechanical systems device of claim 1, wherein the electrical interconnect in the peripheral region is encapsulated by a protective layer and wherein the conductive material in the display region is at least partially exposed.

35. The microelectromechanical systems device of claim 34, further comprising a support structure in the display region, wherein the protective layer comprises material of the support structure.

36. The microelectromechanical systems device of claim 34, wherein the protective layer comprises the mechanical layer.

37. The microelectromechanical systems device of claim 34, wherein the protective layer comprises a layer of reflective material.

38. The microelectromechanical systems device of claim 26, wherein the portion is made from a material that is selectively etchable with a material of the movable layer.

39. The microelectromechanical systems device of claim 26, wherein the electrical interconnect in the peripheral region is encapsulated by a protective layer.

40. The microelectromechanical systems device of claim 39, further comprising a support structure in the display region, wherein the protective layer comprises material of the support structure.

41. The microelectromechanical systems device of claim 39, wherein the protective layer comprises the mechanical layer.

42. The microelectromechanical systems device of claim 39, wherein the protective layer comprises a layer of reflective material.

43. The method of claim 29, further comprising, before selectively removing the conductive material, forming a protective layer encapsulating the conductive material in the peripheral region.

44. The method of claim 43, wherein forming the protective layer comprises forming a support structure over the conductive material.

45. The method of claim 43, wherein forming the protective layer comprises depositing the mechanical layer.

46. The method of claim 43, wherein forming the protective layer comprises forming the movable layer.

47. The method of claim 43, wherein the conductive material is selectively etchable relative to material of the protective layer.

* * * * *